United States Patent
Hoekstra

(10) Patent No.: US 11,174,150 B2
(45) Date of Patent: Nov. 16, 2021

(54) FLEXIBLE MEMBRANE

(71) Applicant: Cirrus Logic International Semiconductor Ltd., Edinburgh (GB)

(72) Inventor: Tsjerk Hans Hoekstra, Balerno (GB)

(73) Assignee: Cirrus Logic, Inc., Austin, TX (US)

( * ) Notice: Subject to any disclaimer, the term of this patent is extended or adjusted under 35 U.S.C. 154(b) by 396 days.

(21) Appl. No.: 15/872,271

(22) Filed: Jan. 16, 2018

(65) Prior Publication Data

US 2018/0208454 A1 Jul. 26, 2018

Related U.S. Application Data

(60) Provisional application No. 62/447,544, filed on Jan. 18, 2017.

(30) Foreign Application Priority Data

Apr. 5, 2017 (GB) ..................................... 1705492

(51) Int. Cl.
*H04R 25/00* (2006.01)
*B81B 3/00* (2006.01)
(Continued)

(52) U.S. Cl.
CPC .......... *B81B 3/0021* (2013.01); *B81B 3/0029* (2013.01); *B81C 1/00158* (2013.01);
(Continued)

(58) Field of Classification Search
CPC .......... B81B 2201/0257; B81B 3/0021; B81B 2201/04; B81B 2201/047;
(Continued)

(56) References Cited

U.S. PATENT DOCUMENTS 3,107,300 A * 10/1963 Stanley ................. G01S 3/7868
250/348
3,904,268 A 9/1975 Keck et al.
(Continued)

FOREIGN PATENT DOCUMENTS

DE 1230087 A1 3/1994
EP 1367855 A1 12/2003
(Continued)

OTHER PUBLICATIONS

Martin, David Thomas. Design, fabrication, and characterization of a MEMS dual-backplate capacitive microphone. University of Florida, ProQuest Dissertations Publishing, 2007. 3299349. http://etd.fcla.edu/UF/UFE0017526/martin_d.pdf (Year: 2007).*
(Continued)

*Primary Examiner* — Phylesha Dabney
(74) *Attorney, Agent, or Firm* — Jackson Walker L.L.P.

(57) ABSTRACT

There is provided a flexible membrane for use in a microelectromechanical transducer, the flexible membrane comprising an electromagnetic waveguide. There is further provided a microelectromechanical system comprising a substrate which comprises the flexible membrane, and a process for forming the flexible membrane. The flexible membrane may be configured to operate within an optical microphone system.

20 Claims, 20 Drawing Sheets

(51) Int. Cl.
*H04R 19/00* (2006.01)
*G01H 9/00* (2006.01)
*B81C 1/00* (2006.01)
*H04R 23/00* (2006.01)
*H04R 31/00* (2006.01)
*H04R 7/04* (2006.01)

(52) U.S. Cl.
CPC ............... *G01H 9/00* (2013.01); *G01H 9/004* (2013.01); *H04R 19/005* (2013.01); *H04R 23/008* (2013.01); *H04R 31/006* (2013.01); *B81B 2201/0257* (2013.01); *B81B 2201/047* (2013.01); *B81B 2203/0109* (2013.01); *H04R 7/04* (2013.01); *H04R 2201/003* (2013.01)

(58) Field of Classification Search
CPC .... B81B 2203/0109; B81B 2203/0127; B81B 3/0027; B81B 3/0029; B81B 7/02; G01H 9/004; G01H 9/00; B81C 1/00158; H04R 2201/003; H04R 23/008; H04R 31/006; H04R 19/005; H04R 7/04
USPC ........................................................ 381/369
See application file for complete search history.

(56) References Cited

U.S. PATENT DOCUMENTS

| | | |
|---|---|---|
| 2007/0165896 A1 | 7/2007 | Miles et al. |
| 2019/0047847 A1* | 2/2019 | Khenkin ............... B81B 3/0018 |
| 2019/0047848 A1* | 2/2019 | Hoekstra ............. B81C 1/00158 |

FOREIGN PATENT DOCUMENTS

| | | | | |
|---|---|---|---|---|
| EP | 2887026 A2 | 6/2015 | | |
| GB | 2147412 A | 5/1985 | | |
| GB | 2466929 A | 7/2010 | | |
| RU | 2047944 C1 | 11/1995 | | |
| WO | WO-0128286 A1 * | 4/2001 | .......... | H04R 23/008 |
| WO | 2009028701 A1 | 3/2009 | | |
| WO | WO-2009028701 A2 * | 3/2009 | ............ | G01H 9/006 |

OTHER PUBLICATIONS

Partial International Search Report, International Application No. PCT/GB2018/050097, dated Apr. 6, 2018.
Combined Search and Examination Report under Sections 17 and 18(3), UKIPO, Application No. GB1705492.5, dated Aug. 14, 2017.

* cited by examiner

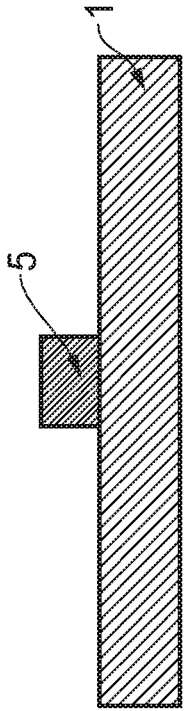
FIG. 4A
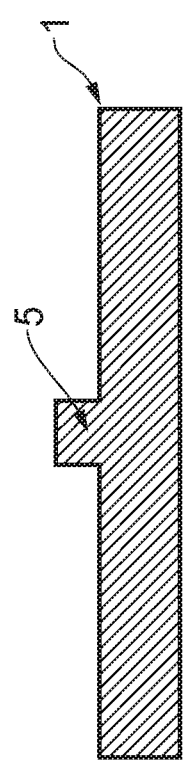
FIG. 4C
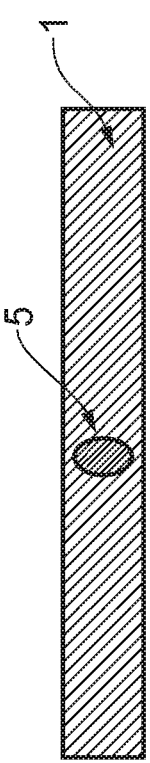
FIG. 4E
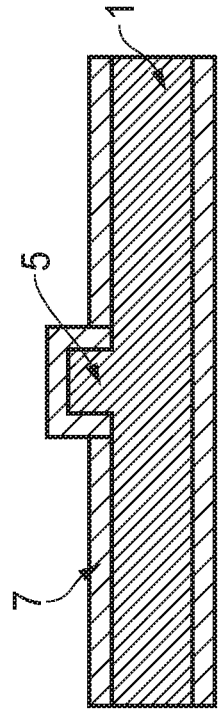
FIG. 4B
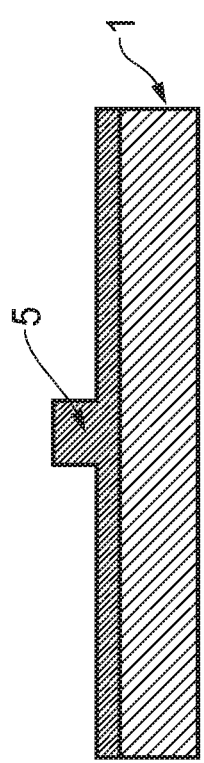
FIG. 4D
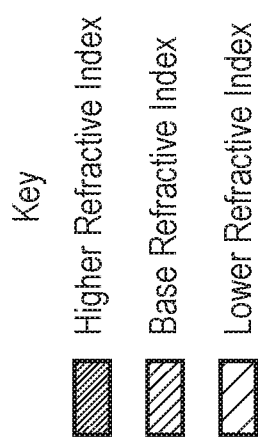

FLEXIBLE MEMBRANE

A flexible membrane, and in particular a flexible membrane comprising an electromagnetic waveguide that is suitable for use in a microelectromechanical (MEM) transducer system.

BACKGROUND

The use of microelectromechanical systems (MEMS) is becoming increasingly prevalent in electronic devices as the physical size of the devices decreases. One of the driving factors resulting in the increased use of MEMS is the market pressure to provide new devices having the same or greater capabilities as existing devices in a physically smaller enclosure. The drive to produce smaller devices having greater capabilities is particularly strong for consumer electronics devices, such as mobile telephones and laptop computers.

A common example of a MEM device that can be found in a broad range of consumer electronics is a MEMS transducer, for example, a MEMS microphone. These devices can be useful wherever it is necessary to detect sound using a compact device. Typically, MEMS microphones operate on the basis of variations in detected capacitance.

An example of a known MEMS microphone that detects sound using variations in capacitance is shown in FIGS. 1A and 1B. FIGS. 1A and 1B show a schematic diagram and a perspective view, respectively, of a known capacitive MEMS microphone device 100. The capacitive microphone device 100 comprises a membrane layer 101 that forms a flexible membrane that is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1A the second electrode 103 is embedded within the back-plate structure 104.

The capacitive microphone is formed on a substrate 105, for example a silicon wafer that may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

A plurality of holes, hereinafter referred to as bleed holes 111, connect the first cavity 109 and the second cavity 110.

In some applications, the microphone may be arranged in use such that incident sound is received via the back-plate. In such instances a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to move between the second cavity and a further volume above the back-plate.

In use, in response to a sound wave corresponding to a pressure wave incident on the microphone, the membrane is deformed slightly from its equilibrium position. The distance between the lower electrode 102 and the upper electrode 103 is correspondingly altered, giving rise to a change in capacitance between the two electrodes that is subsequently detected by electronic circuitry (not shown). The bleed holes allow the pressure in the first and second cavities to equalise over relatively long timescales (in acoustic frequency terms, timescales of the order of milliseconds are typical) which reduces the effect of low frequency pressure variations, e.g. arising from temperature variations and the like, but without impacting on sensitivity at the desired acoustic frequencies.

In known MEMS microphone devices, such as the device shown in FIGS. 1A and 1B, the passage of sound through acoustic holes in the back plate may generate noise, reducing the quality of detected sound. The requirement to provide a back plate electrode of sufficient area to allow the capacitive system to function can also limit the acoustic performance of known MEMS capacitive microphone devices. Further, as technology progresses, devices having superior acoustic response and smaller dimensions than are possible using current capacitive technologies will be required.

It is desirable to provide a MEMS device having a lower susceptibility to noise and/or that can be incorporated within a smaller enclosure, particularly for MEMS devices configured for use as microphones. It is also desirable to provide an optical microphone that can be efficiently mass produced, particularly for use in consumer electronics.

STATEMENTS OF INVENTION

There is provided a flexible membrane for use in a microelectromechanical (MEM) transducer, the flexible membrane comprising an electromagnetic waveguide. The flexible membrane beneficially provides, in conjunction with the electromagnetic waveguide, a versatile sensing component which is applicable to a broad range of sensing applications.

The electromagnetic waveguide may advantageously be formed integrally with the flexible membrane. Thus the electromagnetic waveguide may be fabricated from substantially the same material as the flexible membrane, as a single piece. This may provide an efficient means for forming the electromagnetic waveguide, and may also ensure that the electromagnetic waveguide and the flexible membrane are firmly connected together. This also simplifies the formation process of the flexible membrane and electromagnetic waveguide, as the flexible membrane and the electromagnetic membrane may be formed together as a unit.

The flexible membrane may advantageously further comprise a balancing member. The balancing member may be configured to balance the electromagnetic waveguide, such that the behaviour of the flexible membrane is more predictable when the membrane is displaced. The balancing member may also act to strengthen the membrane.

Where a balancing member is used, the substance or material used to form the flexible membrane and to form the balancing member may be substantially the same substance (which may also be used to form the electromagnetic waveguide). Use of the substantially the same substance to form the flexible membrane and the balancing member provides a good connection between the flexible membrane and the balancing member, and also simplifies the formation process, particularly where the balancing member is formed as a single piece with the flexible membrane. The flexible membrane may be formed from silicon nitride, polyimide, silicon dioxide or polysilicon.

There is also provided a microelectromechanical system comprising a substrate, the substrate comprising the flexible membrane. By integrating the flexible membrane into a broader system, it is possible to provide a complete sensing apparatus in a comparatively small and inexpensive package.

The flexible membrane may be configured to deform when sound waves are incident upon the surface of the flexible membrane, and the microelectromechanical system may be configured to operate as an optical microphone. Examples are particularly suited for use as optical microphones (wherein the stimulus causing the deformation of the flexible membrane is an incident sound wave), providing systems that are less prone to noise, have a larger sensitivity range and are more reliable and resilient than prior art systems. Where the membrane layer comprises a connecting section that is connected to a support section of the substrate, the flexible membrane may comprise a plurality of spring slits located in a region of the flexible membrane between a centre of the flexible membrane and the connecting section. The substrate may comprise integrated circuitry. The substrate may comprise an integrated circuit die, the integrated circuit die comprising analogue circuitry and/or digital circuitry. Further, the integrated circuit die may comprise a programmable digital signal processor.

There is also provided a method for forming a flexible membrane comprising an electromagnetic waveguide, the method comprising: forming an etch stop layer on a wafer; depositing a membrane formation layer over the etch stop layer; etching the membrane formation layer to form the flexible membrane and the electromagnetic waveguide; etching through the wafer to the etch stop layer; and removing the etch stop layer. This process is an example of a process suitable for forming a flexible membrane comprising an electromagnetic waveguide; steps may be added to or removed from the process as required, and alternative processes may also be used to form flexible membranes comprising electromagnetic waveguides.

DESCRIPTION OF FIGURES

The invention will now be further described, by way of example only, with reference to the following figures, in which:

FIG. 4A shows a cross section diagram of a ridge type electromagnetic waveguide in accordance with an example.

FIG. 4B shows a cross section diagram of a strip type electromagnetic waveguide in accordance with an example.

FIG. 4C shows a cross section diagram of a cover type electromagnetic waveguide in accordance with an example.

FIG. 4D shows a cross section diagram of an electromagnetic waveguide including a shielding layer, in accordance with an example.

FIG. 4E shows a cross section diagram of a gradiated refractive index type electromagnetic waveguide in accordance with an example.

DETAILED DESCRIPTION

Figure 1A:
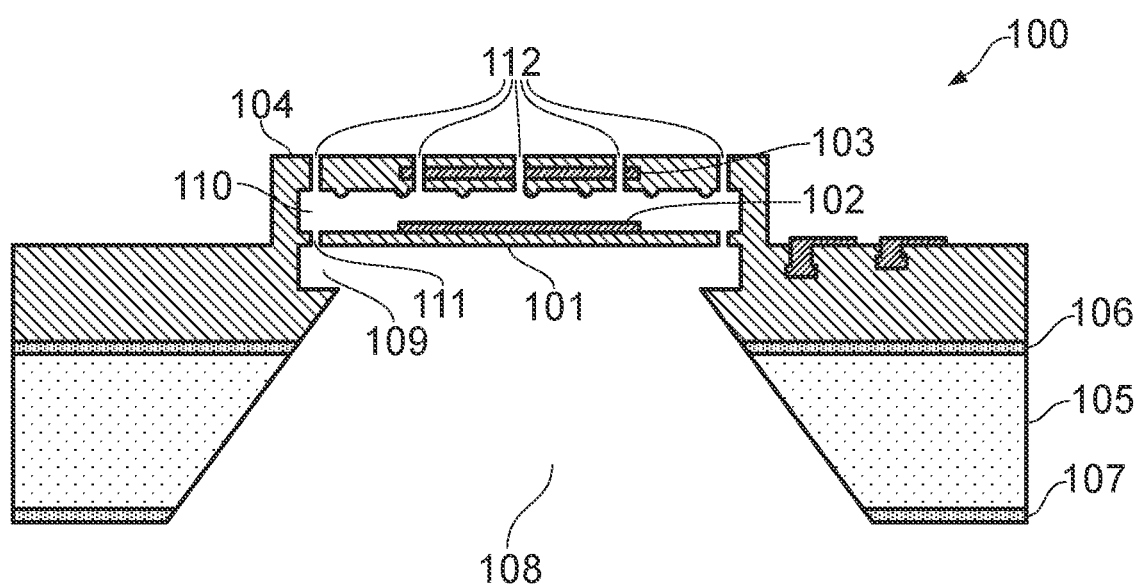
FIGS. 1A and 1B shows representations of a known capacitive MEMS microphone.
Figure 1B:
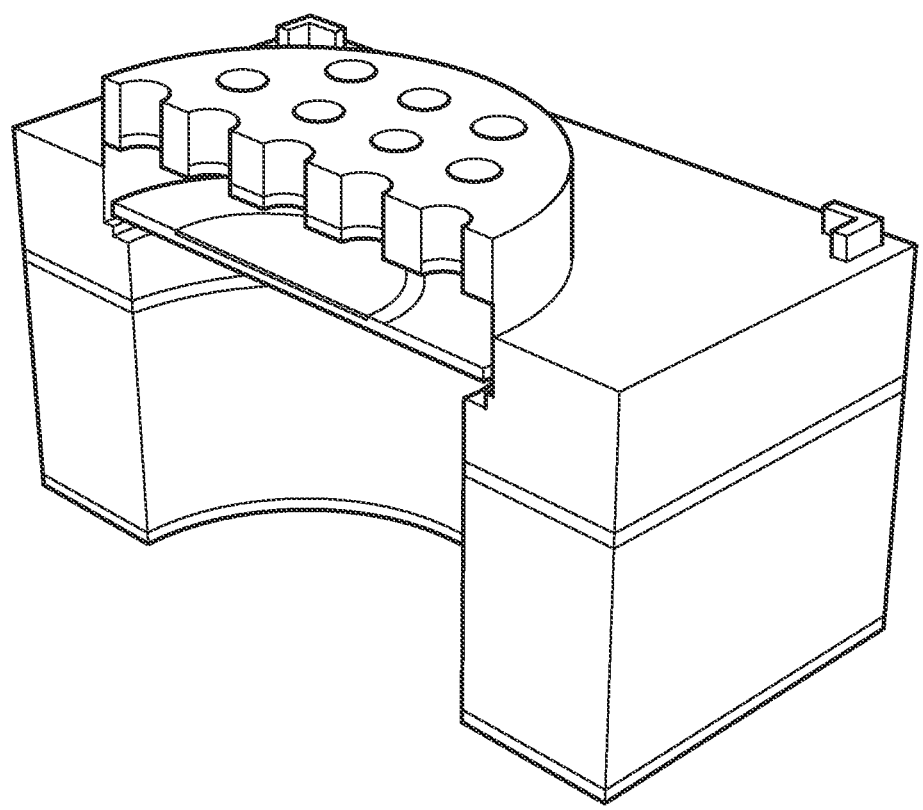
Figure 2:
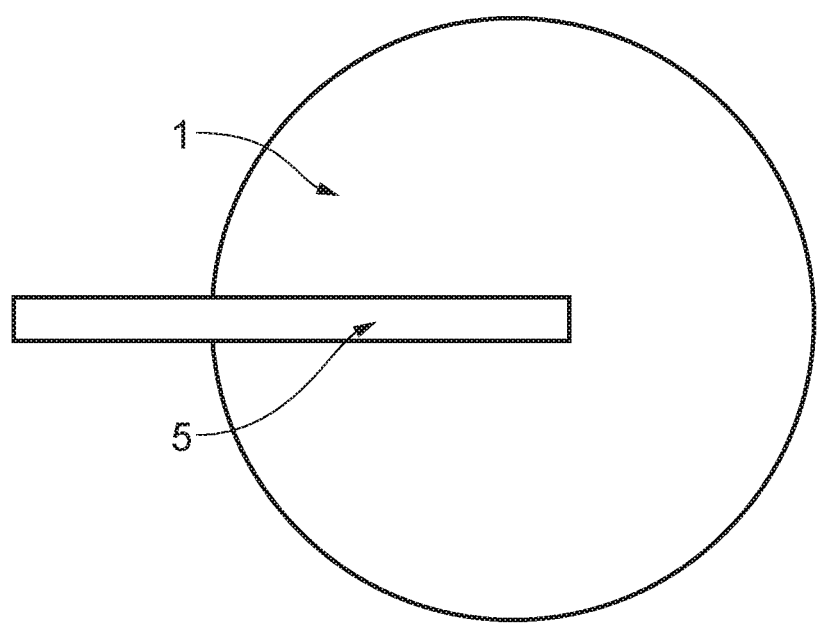
FIG. 2 shows a schematic representation of a first example of a flexible membrane.
Figure 3:
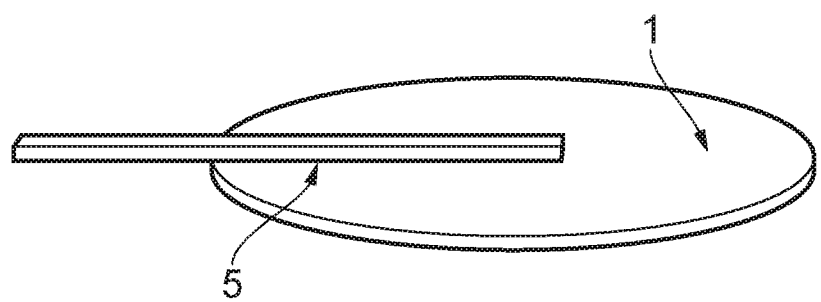
FIG. 3 shows a perspective view of the first example of a flexible membrane as shown in FIG. 2.

FIGS. 2 and 3 illustrate a first example of a flexible membrane 1 comprising an electromagnetic waveguide 5. FIG. 2 is a plan view, FIG. 3 is a perspective view. In the example shown in FIGS. 2 and 3, the membrane has a circular shape. The circular shape provides advantages for some applications in terms of oscillatory modes of the flexible membrane. This provides a predictable and easily modelled response to displacement, due in part to the highly symmetrical nature of this membrane shape. However the membrane is not limited to this shape and any suitable shape can be used, as discussed below. The most suitable shape for any given flexible membrane is largely determined by the intended use of the flexible membrane.

The flexible membrane 1 comprises an electromagnetic waveguide 5. Cross sections of examples of electromagnetic waveguides 5 are shown in FIGS. 4A to 4E. The electromagnetic waveguide 5 is configured to constrain the propagation of electromagnetic waves of a given wavelength range, thereby controlling the direction of propagation of an electromagnetic wave. The example of an electromagnetic waveguide shown in FIGS. 2 and 3 (and FIG. 4A) is a rib-type electromagnetic waveguide, although other types of waveguide can be used. Rib-type waveguides are efficient and can be manufactured comparatively simply, particularly when the waveguide and flexible membrane are formed from the same material.

The electromagnetic waveguides function by constraining the movement of electromagnetic waves perpendicular to the primary axis of the waveguide to maintain a beam of electromagnetic energy along and concentrated within the waveguide. The nature of the electromagnetic waveguides means that there is a limited wavelength (or frequency) range for which each given electromagnetic waveguide will function. This range is determined by the geometry of the electromagnetic waveguide. An approximate rule is that the largest wavelength of an electromagnetic wave that can be constrained within a given electromagnetic waveguide is one having a wavelength double that of the largest dimension of the cross section of the waveguide. In the example shown in FIGS. 2 and 3, the electromagnetic waveguide may be configured to constrain electromagnetic waves in the visible region of the electromagnetic spectrum, that is, optical electromagnetic waves having wavelengths in the approximate region between 390 nm and 700 nm. This provides an optical waveguide which can easily be incorporated within a sensing system, particularly as a large number of components for generating and detecting optical wavelength electromagnetic waves are freely available and well understood. In particular, an optical waveguide such as the example shown in FIGS. 2 and 3 may be configured to guide visible light having wavelengths between 650 nm and 550 nm. This wavelength range lies in the red region of the electromagnetic spectrum. Red light sources (such as LEDs) are freely available, and generally efficient. Further, electromagnetic waveguides configured to use this wavelength range have geometries which naturally match well with other structures (such as the flexible membranes and MEMS structures) and which are easily formed using standard etching techniques as discussed below. However, the electromagnetic waveguide can be configured to constrain electromagnetic waves from any useful region of the spectrum, depending upon the purpose and geometry of the flexible membrane. For example, infrared or ultraviolet electromagnetic radiation can also be used, as could radiation from elsewhere in the electromagnetic spectrum.

Various different materials may be used to form the flexible membrane and the electromagnetic waveguide, depending on the required properties of the flexible membrane (such as degree of rigidity, electrical conductivity, and so on) and of the electromagnetic waveguide (such as transparency to a given region of the electromagnetic spectrum, shape of waveguide, and so on). For example, the flexible membrane and the electromagnetic waveguide may both be formed from polyimide, which provides various benefits for certain uses as discussed above. The electromagnetic waveguide may also be formed from silicon dioxide (silica, $SiO_2$) or silicon nitride ($Si_3N_4$), both of which have excellent transparency over a broad electromagnetic wave wavelength range. These materials have excellent mechanical properties, in terms of the flexibility, elasticity and robustness of the materials. Other suitable materials include silicon (Si), silicon oxynitride (SiON), aluminium oxide ($Al_2O_3$), lithium niobate ($LiNbO_3$) and various polymers.

When the selection of materials to be used in forming the flexible membrane and the electromagnetic waveguide is made, it is necessary to consider the bond between the flexible membrane and the electromagnetic waveguide. It is helpful if the mechanical properties (such as rigidity) of the membrane and the waveguide are similar, and also if a strong bond can form between the surfaces of the waveguide and the membrane. If the bond between the membrane and the waveguide is insufficiently strong, or the relative rigidities of the membrane and the waveguide are too disparate, then the movement of the flexible membrane may cause the waveguide to become detached from the membrane and/or to break. Alternatively, the waveguide itself may restrict the movement of the flexible membrane and interfere with the vibrational response of the membrane. Use of a shielding layer and/or a layer incorporating the waveguide that covers a substantial portion of the flexible membrane surface can also act to improve the strength of the connection between the flexible membrane and the waveguide, but can also interfere with the movement of the membrane. These factors are taken into consideration when selecting one or more materials for use in the flexible membrane and the electromagnetic waveguide.

The flexible membrane can be made from any material having suitable properties. The membrane is required to be sufficiently robust to withstand the forces that are applied to it from the surrounding architecture, from received pressure waves (such as sound waves, waves in fluid or gas, etc.), from contact with matter, from electrical or electrostatic charges and so on. However, the membrane must also be sufficiently flexible to elastically (rather than plastically) deform (and potentially displace), as this is required for most applications of the flexible membrane. For example, if the membrane is to be used in the detection of sound waves, the membrane must be sufficiently flexible to deform/displace when sound waves are incident, such that the sound waves can be detected, but then return to an undisplaced position (rather than plastically deforming) such that subsequent sound waves can be detected.

The material from which the membrane is formed is at least partially determined by the intended function of the membrane. Silicon nitride ($Si_3N_4$) provides an excellent combination of flexibility and resilience, and therefore is utilised in a broad range of membrane applications. A further material which may be used in a broad range of membrane applications is polyimide.

A further benefit of the use of silicon nitride as the membrane material relates to the optical properties of the material. Silicon nitride is optically transparent to a broad wavelength range of electromagnetic waves. If the flexible membrane 1 is to be used in an application utilising electromagnetic waves that fall within the optical transparency range of silicon nitride, this property can make the design and formation of the flexible membrane 1 easier than would otherwise be the case. This is discussed in greater detail below.

There are also particular benefits associated with the use of polyimide as the membrane material. Polyimide materials can be tailored to provide the required degree of flexibility for a variety of intended uses of the flexible membrane. Polyimide membranes are also typically lightweight, and can be formed so as to be transparent to electromagnetic waves, as is also the case with silicon nitride based membranes.

A particular benefit of the use of polyimide based flexible membranes results from the incorporation of the flexible membranes into a broader system. In some applications the flexible membrane is used as a component within an optical microphone system, as discussed in greater detail below. When the optical microphone is to be employed within a portable electronic device (such as a laptop computer or mobile phone), the optical microphone may be mounted onto a flex circuit within the portable device. A flex circuit is an electronic circuit formed by mounting electronic components onto a flexible plastic circuit substrate (which may be formed from a variety of plastic materials, including polyimide, polyester, polyether ether ketone, and so on). If the flexible membrane is formed from the same material as the base material of the flex circuit (for example, polyimide), the flexible membrane may be formed as part of the flex circuit, which reduces manufacturing time and complexity.

An electromagnetic waveguide 5 may be formed from substantially the same material as the flexible membrane (that is, integrally with the flexible membrane). The electromagnetic waveguide may also be formed from a different material, depending on the specific requirements of the system. Where substantially the same material is used for the electromagnetic waveguide as for the membrane (and potentially the base material of the flex circuit), manufacturing time, complexity and cost is further reduced. This is particularly true where the flexible membrane and electromagnetic waveguide are fabricated as a single piece; this both reduces the number of steps required to form the flexible membrane and the electromagnetic waveguide and ensures that the flexible membrane and the electromagnetic waveguide remain firmly connected together. However, even in the event that the flexible membrane and the electromagnetic waveguide are formed from the same material but separately (that is, not as a single piece), the use of the same material for the flexible membrane and the electromagnetic waveguide can still aid in the formation of a bond between the two.

In some examples, such as the example shown in FIG. 4A, the flexible membrane and the electromagnetic waveguide may be formed from substantially the same material, where the use of the term "substantially" indicates that there may be minor differences between the materials used in the flexible membrane and the electromagnetic waveguide, but these differences do not significantly alter the operational behaviour of the flexible membrane or the electromagnetic waveguide. Forming the membrane and the waveguide from substantially the same material can help obviate any issues arising from the bond between the membrane and waveguide. However, it is necessary to locate a material that has suitable properties to be used as the basis of both the membrane and the waveguide. For some uses of the flexible membrane, such as uses in which the waveguide is configured to operate with optical electromagnetic radiation, silicon nitride ($Si_3N_4$) provides suitable properties for both the flexible membrane and the electromagnetic waveguide.

In the event that the flexible membrane and the electromagnetic waveguide are integrally formed from substantially the same material, for example, silicon nitride ($Si_3N_4$), typically a rib-type waveguide is used. This is because the formation of a layer from a single material can make the use of a gradiated refractive index-type waveguide as shown in FIG. 4E (which depends upon the use of different layers within the waveguide having different refractive indexes) difficult, as it is then necessary to introduce variations in the refractive index of the single material. By contrast, where a single material is used to form the flexible membrane and the electromagnetic waveguide, a rib-type waveguide can easily be formed.

The flexibility of the flexible membrane allows the membrane to displace from an equilibrium (undisplaced, quiescent) position in response to incident pressure waves, or other stimuli. This makes the membrane suitable for use in sensing devices, such as microphones, particle detectors, gas pressure sensors, and so on, wherein the nature of the movement of the flexible membrane from a rest position can be monitored in order to determine the properties of the incoming physical stimulus.

As mentioned above, FIG. 4 shows cross section diagrams of examples of the forms that the electromagnetic waveguide can take. Rib waveguides (as shown in FIG. 2) can be divided into two different sub types: waveguides formed from the same material as the supporting member (for example, the flexible membrane), and waveguides formed from different material to the supporting member. Where the waveguide is formed from the same material as the supporting member (as shown in FIG. 4A), this can be referred to as a ridge waveguide. Where the waveguide is formed from a different material to the supporting member (as shown in FIG. 4B), this can be referred to as a strip waveguide.

In the example shown in FIG. 4A, the electromagnetic waveguide is formed from the same material as the flexible membrane, such that the waveguide is a ridge waveguide. Various benefits in terms of the resilience and ease of construction of the flexible membrane and electromagnetic waveguide can be provided where the flexible membrane and electromagnetic waveguide are formed from the same material, as discussed in greater detail below.

Where the electromagnetic waveguide is formed from a different material to the flexible membrane (forming a strip waveguide, as shown in FIG. 4B) the waveguide is typically formed from a material having a high refractive index. The example shown in FIG. 4B has a flexible membrane that is transparent to electromagnetic waves, and that is of a lower refractive index than the attached waveguide. However, where the waveguide and the flexible membrane are formed from different materials, there is no requirement for the flexible membrane to be transparent to waves from any particular region of the electromagnetic spectrum, and the flexible membrane may therefore be opaque to a region of the electromagnetic spectrum that is constrained by the waveguide.

In some examples the waveguide is formed from a different material to the majority of the flexible membrane, but this different material forms a layer covering a substantial portion of a surface of the flexible membrane upon which the waveguide is formed. Waveguides formed as a portion of a layer covering a substantial portion of the surface of the flexible membrane can be referred to as cover waveguides. An example of this type of waveguide is shown in FIG. 4C.

As discussed above, there is no requirement for the material used to form the flexible membrane to have any particular transmission properties where the flexible membrane and the electromagnetic waveguide are formed from different materials. In the example shown in FIG. 4C, the waveguide and the layer covering a substantial portion of the flexible membrane are formed from a material having a higher refractive index than the flexible membrane. The primary benefit garnered from this configuration is the ease of formation of the electromagnetic waveguide and flexible membrane. This is because the structure can be formed by applying a layer of the material that is used to form the waveguide onto the flexible membrane and then etching away the superfluous material, without significant risk of damaging the flexible membrane.

In all of the examples shown in FIGS. 4A, 4B and 4C, the majority of the outer surface of the waveguide is exposed to the surrounding environment (which may be air, another gas, fluid, vacuum, and so on). This means that the refractive index difference between the refractive index of the material forming the waveguide and the refractive index of the surrounding environment is a determining factor in the containment efficiency of the electromagnetic waveguide. In some examples, the electromagnetic waveguide may comprise a shielding layer 7, such that the waveguide is separated from the surrounding environment by the shielding layer. An example where the waveguide is separated from the environment by a shielding layer is shown in FIG. 4D. In the example shown in FIG. 4D, the electromagnetic waveguide is a ridge-type electromagnetic waveguide, however the shielding layer may be used in any of the different types of electromagnetic waveguide as desired. The shielding layer protects the waveguide from damage. In the example shown in FIG. 4D the shielding layer 7 is also used to protect the surface of the flexible membrane opposite to the surface on which the waveguide is located, however the shielding layer may also be applied only to one of the surfaces of the flexible membrane.

Damage to the waveguide such as scratches or cracks can impair the transmission ability of the waveguide, and can allow electromagnetic waves to escape confinement, so the use of the shielding layer is of particular benefit in situations where the waveguide may be abraded, suffer impact damage or otherwise be compromised. Light leakages can also be caused if contaminant material comes into contact with the outer surface of the waveguide (for example, dust in a volume in fluid communication with the waveguide surface); which is also prevented by the use of a shielding layer.

One of the factors influencing the confinement ability of the waveguide is difference in refractive index between the waveguide and the material that abuts the waveguide. Typically, where the material surrounding the waveguide is air, fluid, gas or vacuum, this material will have a low refractive index and the confinement ability of the waveguide will not be significantly impaired by the material junction with the surrounding material. However, when the surrounding material is a shielding layer, the material for this layer is a solid material chosen to have a lower refractive index than the waveguide, so as to avoid impairing the confinement ability of the waveguide. The material selected for the shielding layer should also be sufficiently physically robust to protect the waveguide from damage, as discussed above. The exact material selected for the shielding layer is determined by the intended use for the flexible membrane, the surrounding operational environment, the physical properties of the flexible membrane and waveguide (which may or may not be formed from the same material), and so on. Examples of suitable materials for use in the shielding layer include several materials that can also be used to form the electromagnetic waveguide, such as silicon nitride, silicon dioxide, silicon oxynitride and polyamide, however any material having a suitable refractive index that is compatible with the structural demands of the system (in particular, the requirements for membrane flexibility) may be used.

In the examples discussed above, the waveguide protrudes to some extent relative to the surface of the flexible membrane (although the waveguide may be covered by a shielding layer, and may therefore not be exposed to the surrounding environment). The waveguide may also be formed within the flexible membrane, such that the waveguide is largely or entirely surrounded by the material of the flexible membrane. Where the electromagnetic waveguides are largely or entirely surrounded by the material of the flexible membrane, the resulting structures may be referred to as a gradiated refractive index waveguides. An example of this type of waveguide is shown in FIG. 4E. Gradiated refractive index waveguides provide protection for the waveguide (from the surrounding membrane material), which reduces the chances of damage to, and electromagnetic wave losses from, the waveguide. Gradiated refractive index waveguides can also be configured to minimise alterations to the relative stiffness of the membrane, which is helpful for providing a predictable membrane response to displacement.

In examples wherein the waveguide is largely or entirely surrounded by the material of the flexible membrane, the waveguide should have a refractive index higher than that of the flexible membrane material, as indicated in FIG. 4E. Using a waveguide that is largely or entirely surrounded by the material of the flexible membrane can also protect the waveguide from damage, as in the case in examples incorporating a shielding layer.

The exact form that the waveguide takes is determined by a plurality of factors, such as the function of the electromagnetic waveguide and the flexible membrane, the materials the components are made from, other structural or manufacturing constraints that a larger system in which the flexible membrane is incorporated are subject to, and so on.

For some configurations of the flexible membrane and electromagnetic waveguide, the presence of the waveguide may interfere with the movement of the flexible membrane and thereby reduce the accuracy with which the stimulus properties may be determined. This is because the waveguide can make a specific region of the membrane (the region containing the waveguide) more rigid than the remainder of the membrane, thereby interfering with the movement of the membrane in response to incident stimuli (such as pressure waves). To mitigate the effects of the waveguide on the response of the membrane, a further example of the flexible membrane includes one or more balancing members 9.

The balancing members 9 are used to produce a more balanced distribution of mass and rigidity across the membrane. As such, the balancing members 9 can be arranged on the membrane in such a way as to be located symmetrically with respect to the waveguide, thereby increasing the rotational symmetry of the flexible membrane and helping to maintain a more balanced or uniform deflection of the membrane (which could otherwise be more unpredictable or non-linear). As the primary function of the balancing members 9 is mechanical, to provide additional mass (and/or rigidity) to areas of the flexible membrane, the exact form of the balancing members 9 can vary. The balancing members each comprise a region of material that is either different from surrounding membrane material, or is in addition to the membrane material. Typically, the balancing members are formed in the same way and with the same form as the waveguide(s) on a given membrane, as this is the most efficient way to ensure that the balancing members act to counteract any asymmetric displacement effect caused by the presence of the waveguide(s). It may also allow the members to be fabricated concurrently with the waveguide, avoiding the expense of extra process steps. However, this is not essential, and the balancing members may be formed in a different way (and/or with a different form) to the waveguide(s).

Figure 5C:
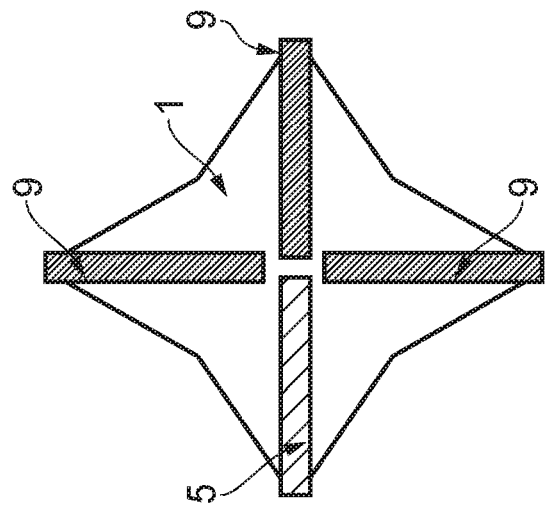
FIGS. 5A to 5C show plan views of flexible membranes including balancing members in accordance with examples.
Figure 5B:
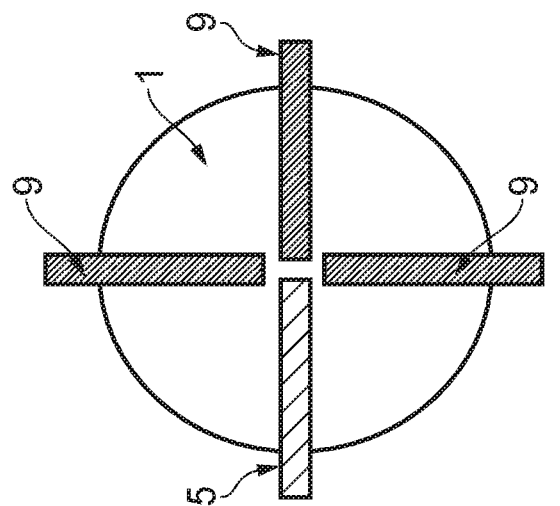
Figure 5A:
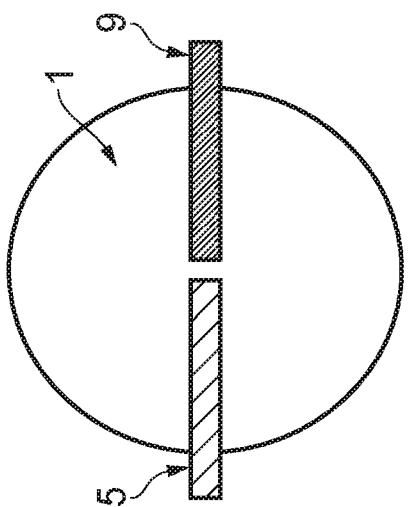

Examples of membranes comprising balancing members are shown in FIGS. 5A, 5B and 5C. In the example shown in FIG. 5A, the flexible membrane 1 includes an electromagnetic waveguide 5. In addition, a single balancing member 9 has been included on the flexible membrane 1, in a position that mirrors the position of the electromagnetic waveguide 5. In the examples shown in FIGS. 5B and 5C, a further two balancing members 9 have been included, wherein the balancing members 9 and the electromagnetic waveguide 5 have been positioned at substantially equal radial intervals around the membrane. This arrangement advantageously increases the rotational symmetry of the flexible membrane 1 about an axis normal to the plane of the membrane.

In some examples the flexible membrane is attached to a further structure (such as a substrate) at a number of discrete points separated by intervals, or through a continuous connection between the flexible membrane and the further structure. Where the membrane is connected at discrete points, the balancing members are particularly useful if positioned so as to provide symmetry about axes passing through the discrete points.

In some examples, the balancing members may be formed from the same material as the electromagnetic waveguide. The balancing members may be structurally identical to the waveguides, except that the balancing members are not configured to constrain incident light. In particular, where the electromagnetic waveguides are partially or entirely surrounded by the flexible membrane material, or wherein a shielding layer is used, the balancing members may also be equivalently surrounded or shielded. The balancing members may therefore be dummy waveguides, that use the same structure to the electromagnetic waveguides but that are not used to guide electromagnetic waves.

The balancing members are used primarily to mitigate the destabilising effects of the electromagnetic waveguides, as discussed above, although the balancing members can also act to increase the rigidity of the flexible membrane (or certain regions of the membrane) if this is desired, or to increase the strength of the flexible membrane.

Figure 6:
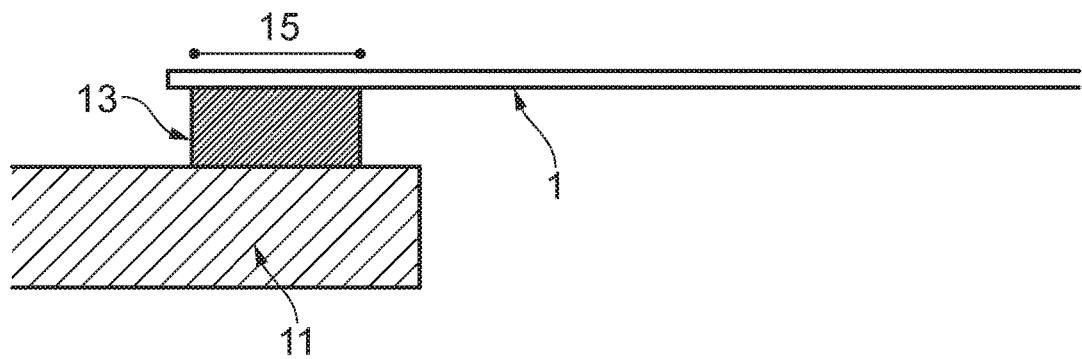
FIG. 6 shows a cross section of a substrate comprising a flexible membrane in accordance with an example.

The flexible membrane is typically anchored at its boundary edges, into a substrate 11, which acts to support the flexible membrane. A cross sectional diagram of a substrate 11 and flexible membrane is shown in FIG. 6 (not to scale). The substrate may support more than one flexible membrane, depending on the requirements of a particular application. References to the substrate comprising "a" membrane should be understood to mean that the substrate comprises "at least one" membrane.

The substrate may comprise various other components, in addition to the one or more flexible membranes. For example, the substrate may also comprise integrated circuitry (that is, active electronic device structures such as transistors) configured to provide the circuitry (for example bias or amplifier circuitry) necessary for operation in a particular role (for example as a microphone). Where the substrate comprises such circuitry, the substrate unit can provide a self-contained functional unit that can easily be incorporated into a broader system. The substrate may comprise an integrated circuit die which, in turn, may comprise analogue or digital circuitry. In particular, the integrated circuit die may comprise a programmable digital signal processor.

In some examples, the substrate comprises a support section 13, and the flexible membrane forms part of a membrane layer. The membrane layer comprises further components in addition to the flexible membrane. An example of a further component is the connecting section 15, as shown in FIG. 6, which is part of the membrane layer but is not able to displace along with the flexible membrane. The connecting section 15 of the membrane layer operates in conjunction with the support section 13 of the substrate 11, such that the position of the connecting section of the membrane layer is fixed with respect to the substrate. Accordingly, the combination of the support section and the connecting section act in unison to connect the flexible portion of the membrane layer to the substrate. Connecting the flexible membrane to the substrate in this way provides a secure and robust connection between the membrane and the substrate, while still allowing the flexible membrane the degree of freedom of movement necessary for sensing applications.

The flexible membrane and the electromagnetic waveguide may be formed using any known process. An example of a process for forming the flexible membrane and electromagnetic waveguide, in conjunction with a substrate that supports the membrane, is discussed below with reference to FIGS. 7A to 7J.

Figure 7A:
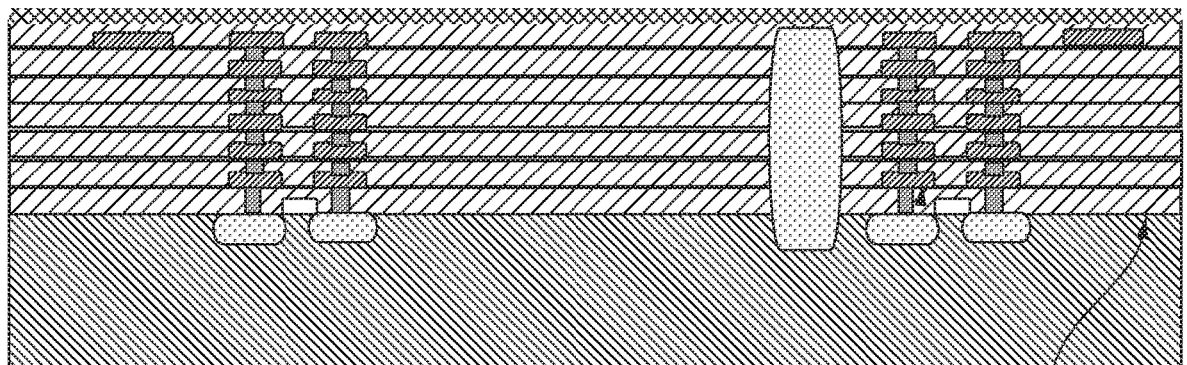
FIGS. 7A to 7J show a series of cross sectional diagrams illustrating a process for producing a flexible membrane comprising an electromagnetic waveguide, in accordance with an example.

In an example of a process for forming the flexible membrane and electromagnetic waveguide, the process begins with an integrated circuit, such as a complementary metal-oxide-semiconductor (CMOS) circuit, formed integrally with a wafer 25. Typically, the circuitry is formed prior to the formation of the flexible membrane. An example of a CMOS wafer is shown in FIG. 7A.

Figure 7B:
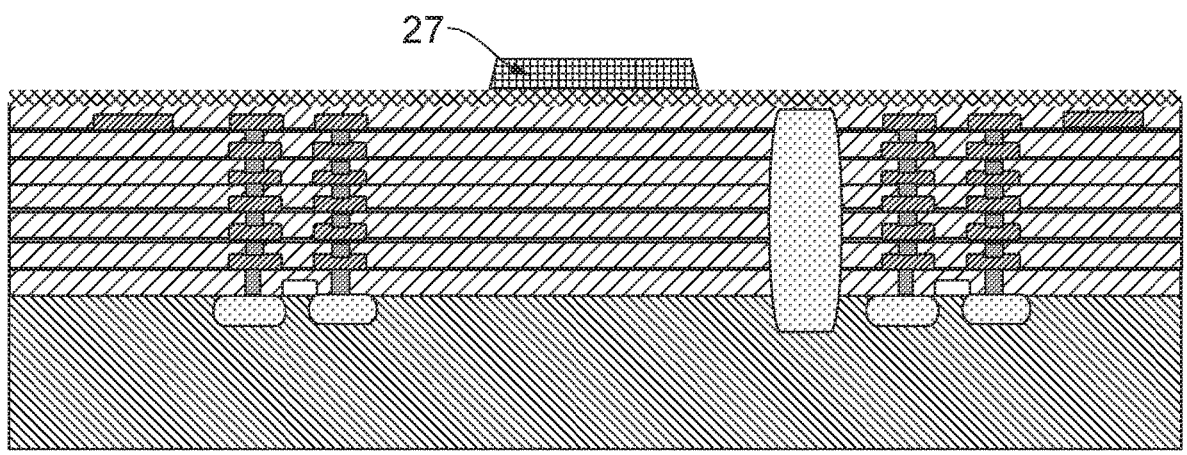
Figure 7C:
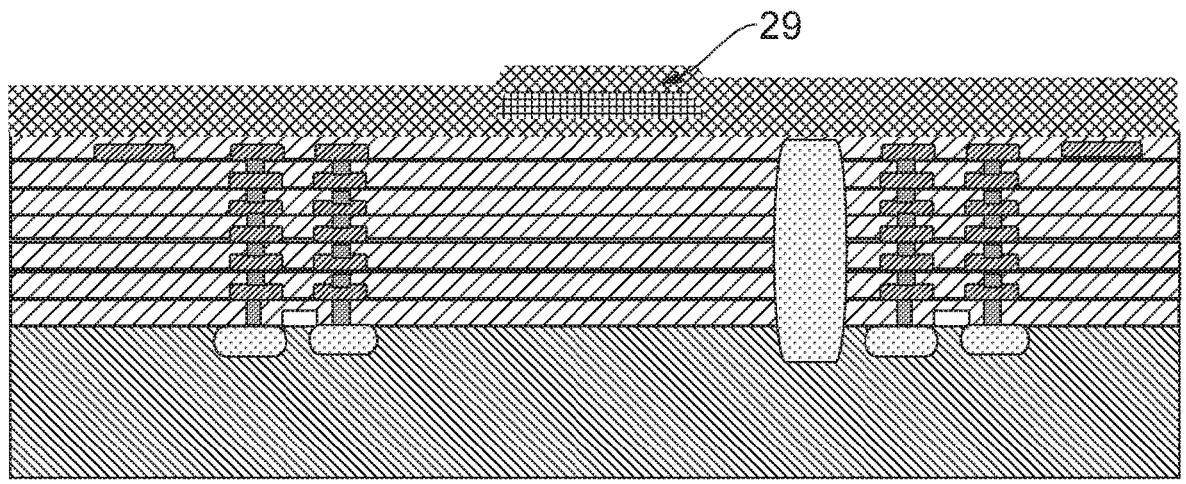

In the example process, an etch stop layer 27 is formed on the CMOS wafer, as shown in FIG. 7B, using conventional deposition and photolithographic etching techniques. Any suitable etch stop material can be used. In the present example polyimide is used as the etch stop material. Following the formation of the etch stop, a membrane formation layer 29 that will ultimately be used to form the flexible membrane is deposited, as shown in FIG. 7C. In the present example, the membrane formation layer is formed from silicon nitride.

Figure 7D:
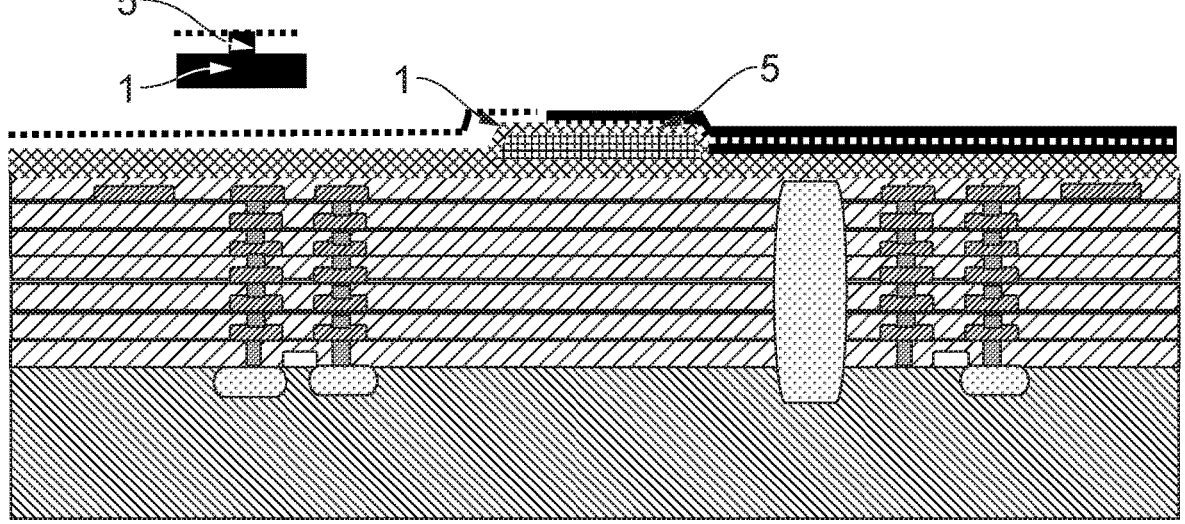

The membrane formation layer is then etched to form the flexible membrane (that is, excess silicon nitride is removed), as shown in FIG. 7D. In the present example, the electromagnetic waveguide 5 is formed from the same material as the flexible membrane 1 and is a ridge type electromagnetic waveguide. Accordingly, the waveguide is etched from the silicon nitride and formed with the membrane. The dotted line on the left of FIG. 7D illustrates nitride material that has been removed. The dotted line on the right illustrates that further nitride material may be removed out of the plane of this cross section. The inset diagram illustrates a cross section of a portion of the waveguide 5 and membrane 1 normal to the plane of the cross section of the main figure. In the event that the electromagnetic waveguide is formed from a different material to the flexible membrane (for example, as a strip type electromagnetic waveguide), the electromagnetic waveguide can be formed directly onto the membrane by similar deposition and etching processes after the membrane has been etched from the membrane formation layer.

Figure 7E:
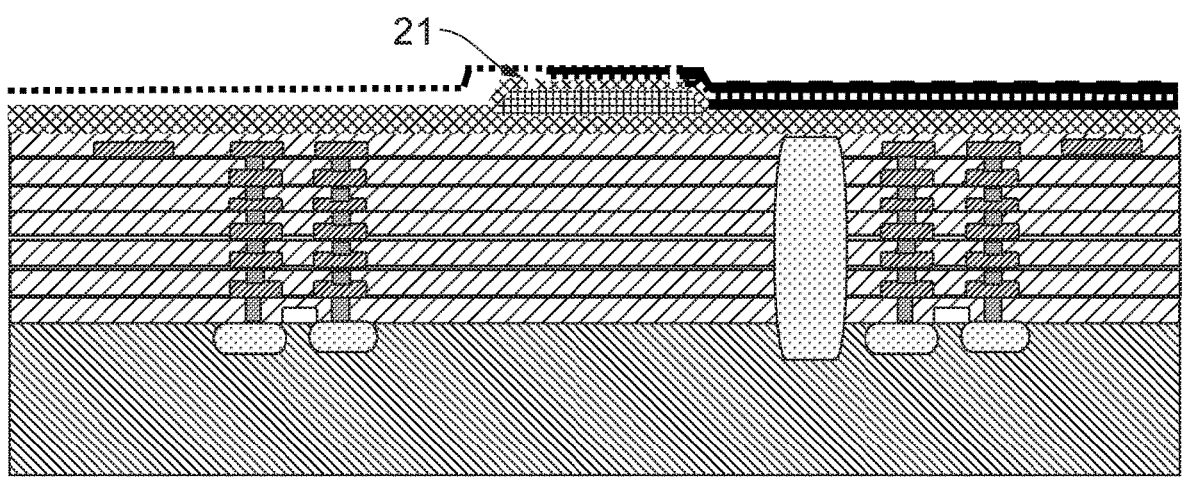

In the present example, the membrane comprises bleed holes (as discussed above). The membrane may also comprise slits at regions of the periphery that are locally separated from the surrounding membrane layer or may comprise peripheral spring structures incorporating slits 21 as discussed below with respect to FIG. 9. The bleed holes or slits are etched from the flexible membrane following the membrane formation. This is shown in FIG. 7E.

Figure 7F:
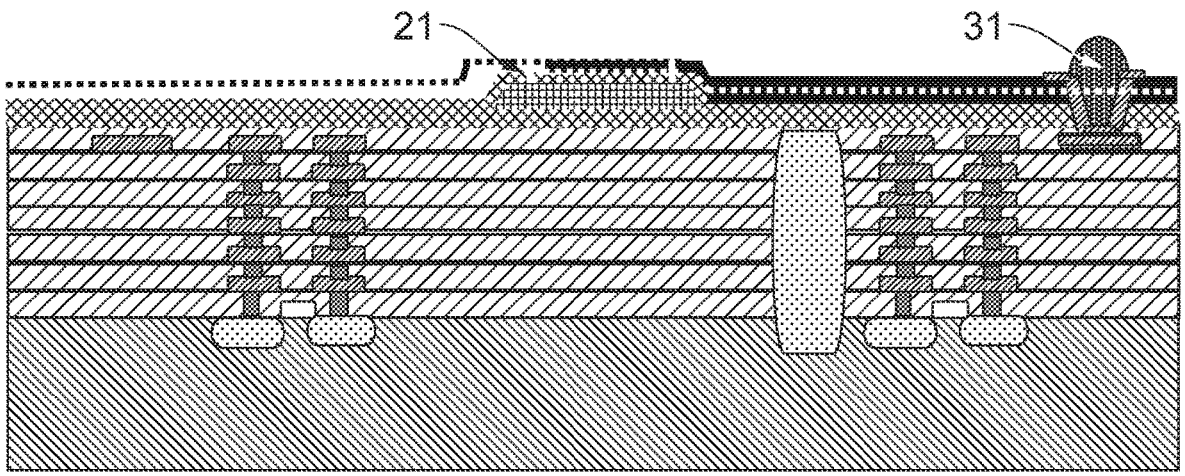

In the present example, a LED 31 is mounted on the wafer. To allow the LED to be integrated into the apparatus, a further etch is performed to leave a hole in which the LED can be mounted. The hole is then lined with a conductive layer via a suitable process, such as sputtering. The LED is then mounted, as shown in FIG. 7F.

Figure 7G:
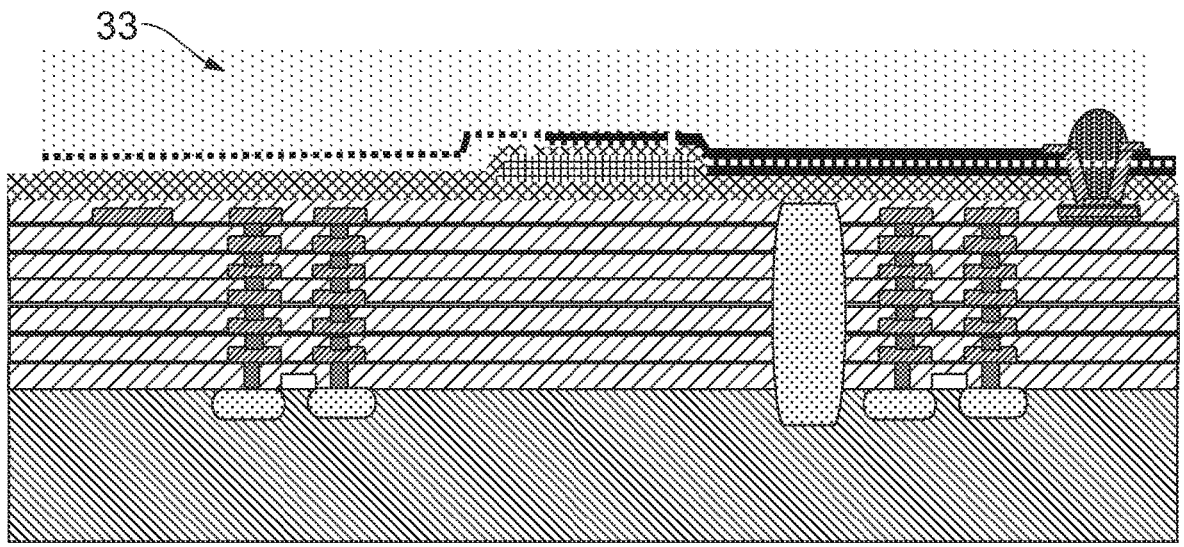

Subsequently a dice mask layer 33 is applied on top of the membrane layer, as shown in FIG. 7G. This layer is used to support the CMOS wafer while processes are performed on the opposite side of the wafer. In the event that a plurality of devices are formed on the same wafer and then singulated, the dice mask can also be used to support the devices during this process.

Figure 7H:
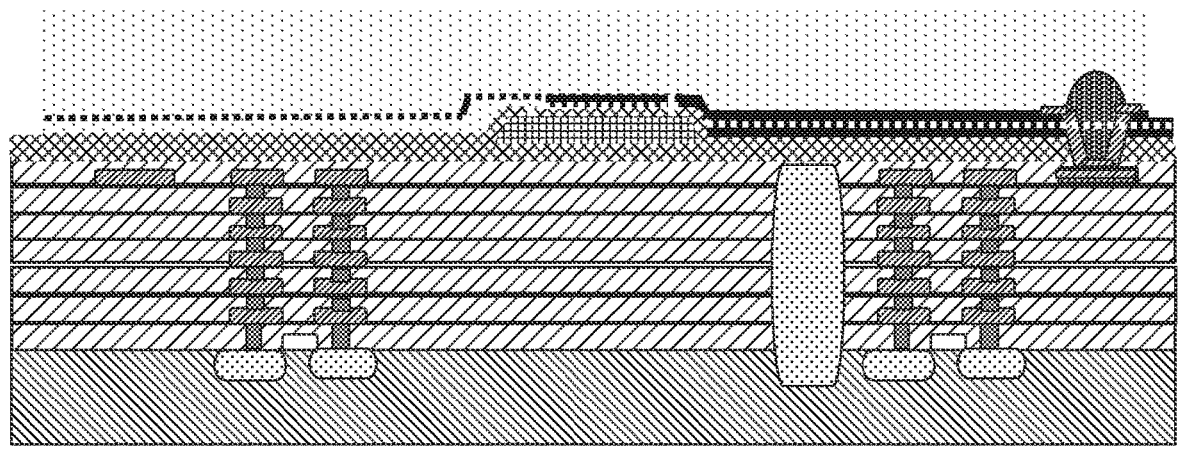

Using the dice mask layer to support the wafer, the silicon of the wafer substrate can then be globally abraded or back-lapped as shown in FIG. 7H. This abrasion thins the whole structure and makes subsequent etching steps (which involve removing portions of the substrate) easier, faster and more accurate.

Figure 7I:
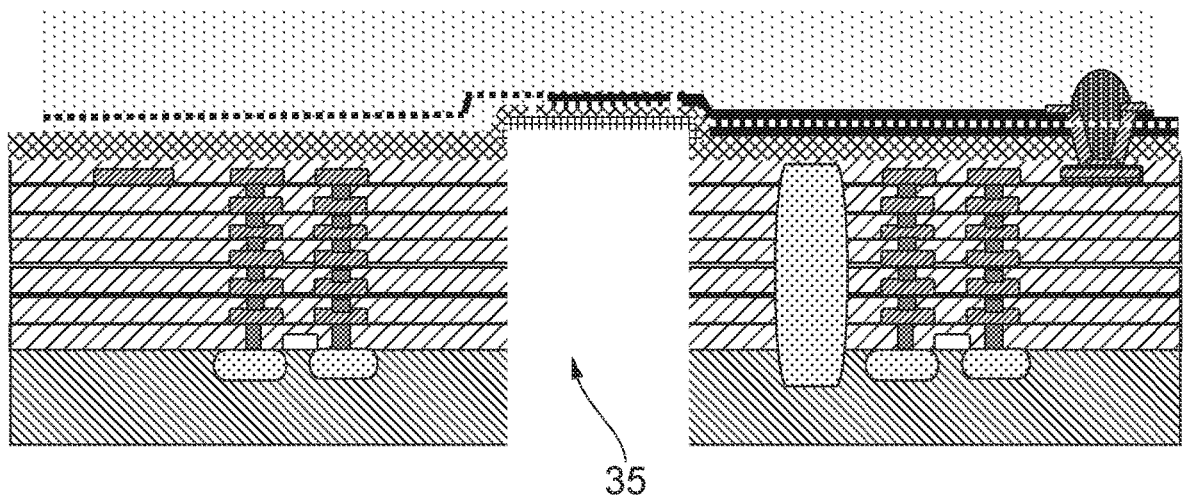
Figure 7J:
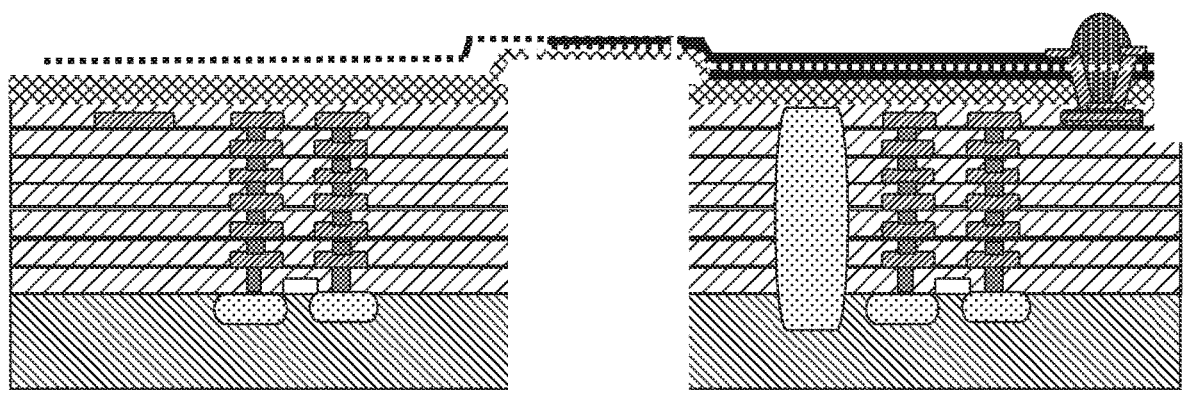

A photolithographic etching process is then performed, removing a volume of the substrate and the body of the CMOS wafer underlying the membrane area, until the etch contacts the etch stop layer deposited as described above. This results in a substrate cavity 35 being formed, as shown in FIG. 7I. Finally, the dice mask layer and etch stop layer are removed to leave the CMOS wafer comprising the flexible membrane (the flexible membrane comprising an electromagnetic waveguide), as shown in FIG. 7J.

The example process described above can be used to form the flexible membranes comprising electromagnetic waveguides, however any other suitable formation method may also be used. In the present example, the flexible membrane is to be used in an optical microphone system. Additional steps may also be included in the method to allow additional features (for example, support scaffolds as discussed below) to be incorporated into the system.

As discussed above, the membrane may be any suitable shape, depending upon the intended use of the membrane and the preferred method of manufacture. For audio applications, circular (or ovaloid) cross-section membranes may be used. This is because the membranes can be formed with a high degree of symmetry, such that the membranes suffer less from distortion when oscillating under the influence of incident pressure waves (such as sound waves) than some other membrane shapes. However, where space saving is a primary consideration and it is necessary to utilise space in the most efficient way possible, some applications of the flexible membranes (including audio applications) may also use a rectangular shape membrane. In the present document, the term "rectangular" encompasses rectangular shape membranes having all four sides of equal length (such that the membrane is square in shape).

The use of a rectangular shape membrane maximises the flexible membrane surface area available for detection within a rectangular-shaped die. This provides the most efficient use of the membrane area, and of the area of a wafer upon which the membrane may be formed. If necessary, it is possible to compensate for any unwanted membrane distortion artefacts electronically.

Figure 8C:
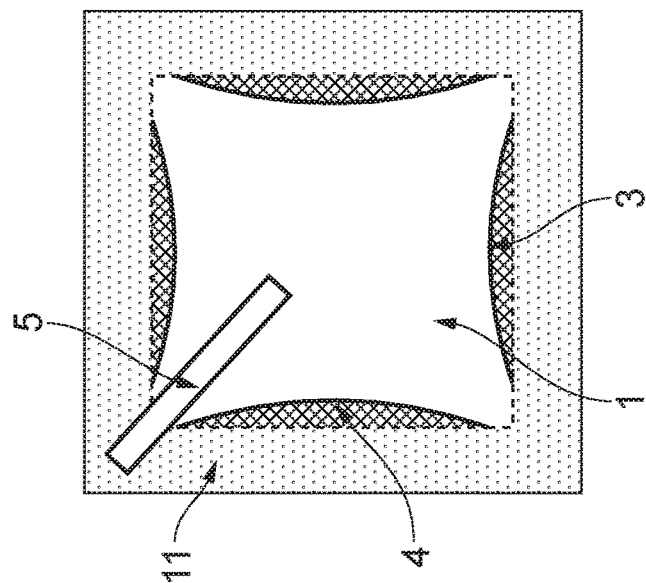
FIG. 8C shows a plan view of a flexible membrane configured to be connected to a further structure at a number of discrete points in accordance with an example.

Sharp corners at the edges of the flexible membrane (where the membrane may be connected to a substrate) can potentially be undesirable for some uses of the flexible membrane. The sections of the flexible membrane in the vicinity of the corners can generate distortion in the membrane, and a non-uniform response to incident pressure waves. Also, the forces passing through the corners of the membrane during vibration can cause these sections of the membrane to be more prone to damage than other sections of the membrane. For these reasons, the flexible membranes may be formed with a generally rectangular shape having rounded corners, as shown in FIG. 8A. In this way, the flexible membrane can be configured to provide a balance between the predictability of vibration and resilience of the circular shape membranes and the increased detection area of the rectangular membranes.

Figure 8B:
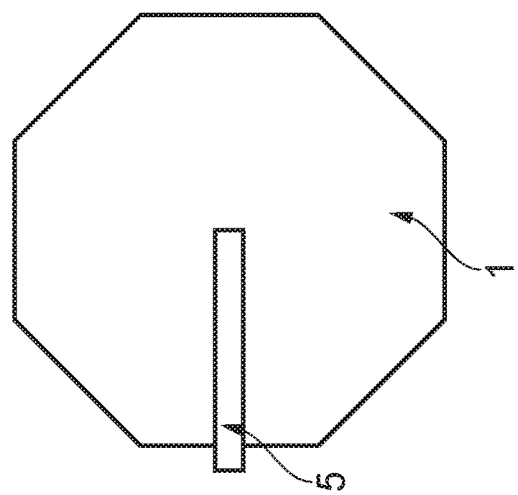
FIG. 8B shows a plan view of an octahedral flexible membrane in accordance with an example.
Figure 8A:
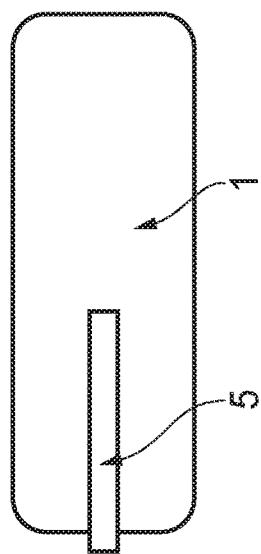
FIG. 8A shows a plan view of a rectangular flexible membrane having rounded corners in accordance with an example.

In addition to rounding off the corners of the membrane, it is also possible to approximate the rounding effect by using a membrane having a larger number of shallower angled corners, for example, an octahedral shape flexible membrane as shown in FIG. 8B. In this way, the inner angles of the membrane corners are increased, and the issues surrounding sharp corners (in terms of distortion and susceptibility to damage) are mitigated. It is also possible to reinforce the corner regions of a flexible membrane to reduce susceptibility to damage, although this does require more complex simulations of the oscillatory behaviour of the membrane relative to unreinforced membranes.

Other flexible membrane shapes may also be used, depending on the specific application for which the flexible membrane is intended. As an example of this triangular, rhomboidal or parallelogram-shaped membranes may be used in applications requiring the flexible membranes to tessellate.

For some applications of the flexible membrane, it is useful if the mechanical connection between the edge of the membrane and a supporting structure (such as a substrate) is not uniform around the periphery of the membrane. In particular, it can be useful if there are slits or gaps 3 between the flexible membrane and surrounding regions of membrane material or other further structures. This gives more flexibility in tailoring the mechanical response of the membrane to incoming stimuli. Thus the membrane may be connected at a number of discrete points (rather than via a continuous connection). An example of a flexible membrane configured to connect to a further structure at a number of discrete points (separated by gaps) is shown in FIG. 8C, which shows an example of a "cowhide" membrane.

The "cowhide" shape membrane is based on a generally square shape membrane. The flexible membrane 1 is connected to a support structure (such as the substrate 11) at discrete points. In the example shown in FIG. 8C, the flexible membrane is connected to the substrate 11 (dotted region in FIG. 8C) at the corners of the flexible membrane, while the sides of the flexible membrane are curved. Gaps 3 are provided between the curved edges of the flexible membrane 1 and the straight edge of a support structure 11 (the gaps 3 are indicated by the solid line in FIG. 8C, while the edge of the support structure 11 is indicated by the dashed line). In the example shown in FIG. 8C, there are further regions of membrane material 4 (indicated by cross-hatching in FIG. 8C) that are part of the membrane layer and that are located between the gaps 3 and the edges of the substrate 11. The further regions of membrane material 4 act to reduce sound pressure wave leakage through these regions.

Figure 9A:
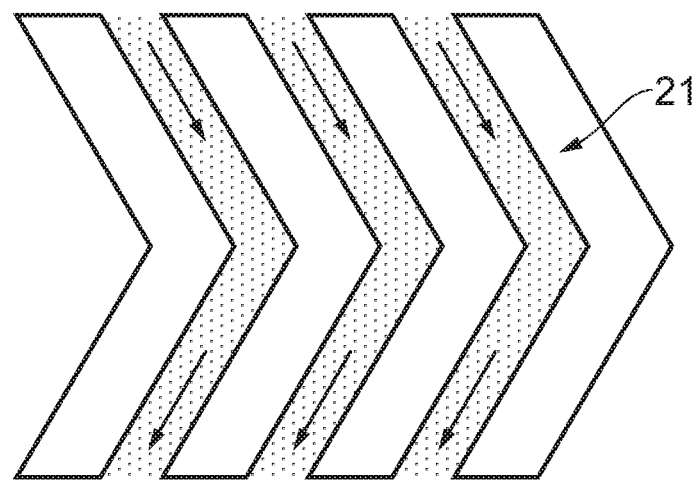
FIG. 9A shows a plan view of a slit configuration, in accordance with an example.

The membrane layer in some examples comprises a plurality of spring slits 21, which are located in the perimeter region of the flexible membrane between the centre of the flexible membrane and the connecting section of the flexible membrane. An example of the slit configuration is shown in FIG. 9A, in which the slits are generally chevron shaped. It is not essential for the shape of the slits to be as shown in FIG. 9A; any configuration which does not significantly impinge on the central region of the flexible membrane or unduly weaken the connection between the flexible membrane and the support section may be used. Other examples of slit shape include S-shaped slits and Z-shaped slits, as well as simple straight slits.

The slits are configured to reduce the rigidity of the region of the flexible membrane between the connecting section and the central region of the membrane. This can be useful if, for example, the material requirements of the flexible membrane (due to operating atmosphere, for example) mean that a flexible membrane without the slits would be too rigid for the intended use of the membrane. By including the slits, it is possible to provide a flexible membrane with a comparatively rigid central region and a comparatively flexible region (comprising the slits), such that the flexible membrane as a whole provides the required degree of responsiveness and flexibility.

Figure 9B:
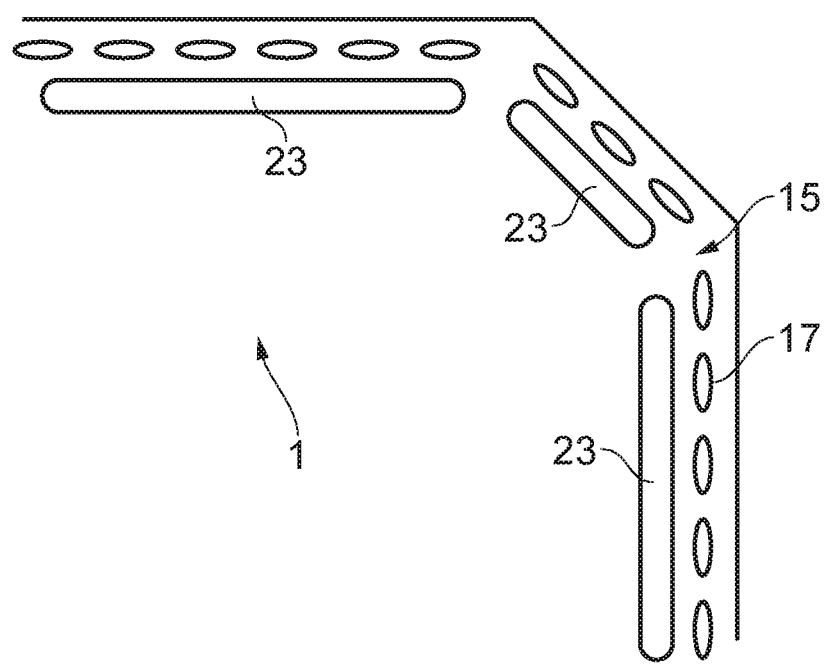
FIG. 9B shows a plan view of a region of a flexible membrane in which a plurality of slits may be formed, in accordance with an example.

In order to provide the required flexibility, the slits are typically located in the perimeter region of the flexible membrane between the centre of the membrane and the connecting section, as discussed above. FIG. 9B shows a plan view of a portion of a flexible membrane. In this example, the flexible membrane has a generally octahedral shape, although the membrane may be any shape as discussed above. The slits are located in the perimeter region of the membrane, as shown in FIG. 9B. In this example, the connecting section of the flexible membrane includes a plurality of slits 23 parallel to the edges of the membrane to allow the central portion of the membrane to move more freely, while still supported via the gaps between slits by support pillars 17 in a peripheral region 15 of the membrane. This configuration fixes the flexible membrane near its periphery to an underlying substrate as discussed above.

For most applications of the flexible membrane, it is necessary that the flexible membrane be free to respond to variations in pressure (such as pressure waves) by moving from an equilibrium or quiescent position. In the event that it is desired for the flexible membrane to have the capacity to move, the connecting section and the support section are configured so as to not prevent the movement of the flexible membrane.

In some examples in which the flexible membrane is a component of a substrate (which itself may be part of a larger microelectromechanical system), further components are also included on the substrate that interact with the flexible membrane and the electromagnetic waveguide. Typically a plurality of separate units (for example, MEMS transducers) are formed collectively on a single wafer, before being singulated. Accordingly, some examples are configured to allow collective production of multiple units on a single wafer.

In some examples, the flexible membrane is a component of an optical microphone 37. As discussed above, known microphones measure the amplitude of incident sound waves by monitoring the variations in capacitance of a capacitor formed with a first electrode on a stationary back plate and a second electrode attached to a flexible layer. In known microphones, the flexible layer is configured to vibrate in response to incident sound waves, altering the separation of the capacitor electrodes and thereby varying the capacitance of the capacitor. Examples may provide an alternative to this configuration, wherein the electromagnetic waveguide is used to carry electromagnetic radiation (typically in the visible region of the spectrum, although electromagnetic radiation from other regions of the spectrum may also be used). The electromagnetic waveguide moves with the membrane. The movement of the waveguide alters the properties of the electromagnetic radiation carried in the waveguide; detection of the alteration allows the properties of incident sound waves to be monitored. This is discussed in greater detail below.

Figure 10:
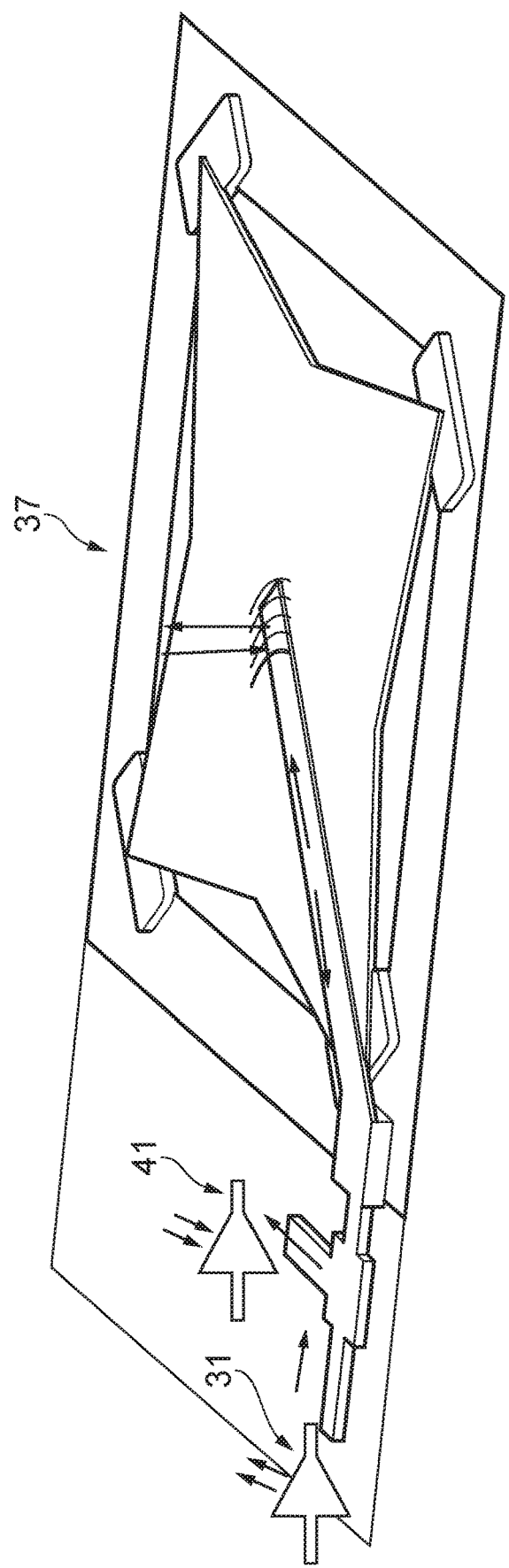
FIG. 10 shows a schematic of an optical microphone in accordance with an example.

An example wherein the flexible membrane forms part of an optical microphone is illustrated in FIG. 10. In addition to the flexible membrane and waveguide, the optical microphone also requires an emitter of electromagnetic radiation and a detector of electromagnetic radiation. These components may be provided separately from the substrate. In some examples of the optical microphone system, a laser emitter is provided separate from the substrate and the coherent light generated by the laser is provided to the substrate (specifically to the electromagnetic waveguide on the flexible membrane) via an optical fibre. Similarly, in some examples, a light detector (such as a photodetector) is provided separately from the substrate and light is provided to the light detector via an optical fibre. Although optical light is typically used, electromagnetic radiation from other regions of the spectrum may also be used as required, for example, an ultraviolet emitter and an ultraviolet detector, or an infrared emitter and detector. Of course, it is necessary for the emitter and detector used in any given example to be compatible.

In the context of optical microphone applications, the electromagnetic wave emitter may be one or more Light Emitting Diodes (LEDs) 31. In the event that the electromagnetic wave emitter is a LED, this may be mounted on the substrate. Typically the LED emission colour is largely determined by the availability of the materials required to form the LED, the efficiency of the LED output, and so on. Red LEDs (that is, LEDs emitting largely in the 610 to 760 nm range) are often used, as these LEDs are comparatively inexpensive to produce and also are commonly more efficient than some other LED colours. Any suitable compounds may be used to form the LED, such as gallium arsenide, gallium phosphide, indium gallium nitride, and so on, as will be familiar to those skilled in the art. LEDs are readily available in a range of different specifications, are relatively inexpensive, and can easily be matched with a suitable electromagnetic wave detector. In addition to standard (non-organic compound based) LEDs, organic LEDs (OLEDs) may also be used as the electromagnetic wave emitters. Organic LEDs differ from normal LEDs in that the emissive element is formed from an organic compound.

The electromagnetic wave emitter may also be a semiconductor laser (laser diode), which has an advantage relative to standard LEDs of producing coherent and collimated light. Coherent and collimated light may more easily and efficiently be coupled into a waveguide than the more diffuse light generated by an LED. Typically, the semiconductor lasers are mounted on the substrate, although this is not essential. In addition to the LEDs and semiconductor lasers, other light emitters may be used (such as incandescent filaments) as dictated by availability and the specific requirements of the system. In addition to standard edge-emitting semiconductor lasers, the electromagnetic wave emitter may also be a vertical-cavity surface-emitting semiconductor laser (VCSEL), which may provide benefits relative to conventional edge-emitting semiconductor lasers in terms of mass production.

In some examples, an electromagnetic wave detector 41 may be formed into the substrate, or incorporated into the substrate, by layering the materials forming the detector as the other substrate features are formed. The example shown in FIG. 10 includes an integral electromagnetic wave detector 41. The formation of the electromagnetic wave detector can result from the deposition of the component materials as other components are formed on the substrate. Typically, one or more photodiodes are used in the electromagnetic wave detector (operating in photovoltaic or photoconductive modes), however other technologies such as photomultiplier tubes (PMTs), quantum dot photoconductors or active-pixel sensors may be used depending on the specific requirements of the system. Photodiodes are comparatively inexpensive and readily available, may be selected to be sensitive to most necessary ranges of incident electromagnetic waves and, if desired, may be formed along with other features of the substrate. Forming the electromagnetic wave detector along with other features of the substrate can increase the speed and simplicity of the construction process, and can also reduce the distances over which electromagnetic waves must be transmitted to reach the electromagnetic wave detector relative to configurations wherein the electromagnetic wave detector is not in close proximity to the membrane (for example, where the detector is located away from the substrate).

In examples configured to operate as an optical microphone, the operation of the device is as follows. An electromagnetic wave emitter (for example, a LED) generates an electromagnetic wave. The electromagnetic wave enters an electromagnetic waveguide, either directly or via a suitable medium such as an optical fibre. At least a portion of the electromagnetic waveguide through which the electromagnetic wave passes is connected to or incorporated within a flexible membrane. A housing for the optical microphone is configured such that sound waves from the environment which it is intended to monitor using the optical microphone can reach the flexible membrane. When sound waves are incident on the flexible membrane, the flexible membrane is configured to move in response to the incident waves, for example, to vibrate. The movement of the flexible membrane causes the path taken by the electromagnetic waves to be altered, which alters the properties of the electromagnetic waves. The alteration is detected at the electromagnetic wave detector. The alteration of the electromagnetic wave properties is proportional to the movement of the flexible membrane, and hence is representative of the properties of the incident sound wave. The electromagnetic waves are then transmitted to an electromagnetic wave detector, where the waves are detected. The alteration of the electromagnetic waves is thus used to deduce the properties of the sound wave.

The type of electromagnetic radiation emitter used for a particular optical microphone configuration is dependent upon several factors, including the nature of the electromagnetic radiation required. Some configurations of the optical microphone utilise measurements of phase shift to monitor flexible membrane movement, and require single phase electromagnetic radiation. Other optical microphone configurations measure variations in the intensity of detected light as a means of monitoring flexible membrane movement, and therefore the provision of single phase electromagnetic radiation is less important for these optical microphone configurations.

Embodiments of optical microphone configurations utilising different arrangements of components to form the optical microphone are discussed below.

Optical Microphone Embodiment 1

Figure 11A:
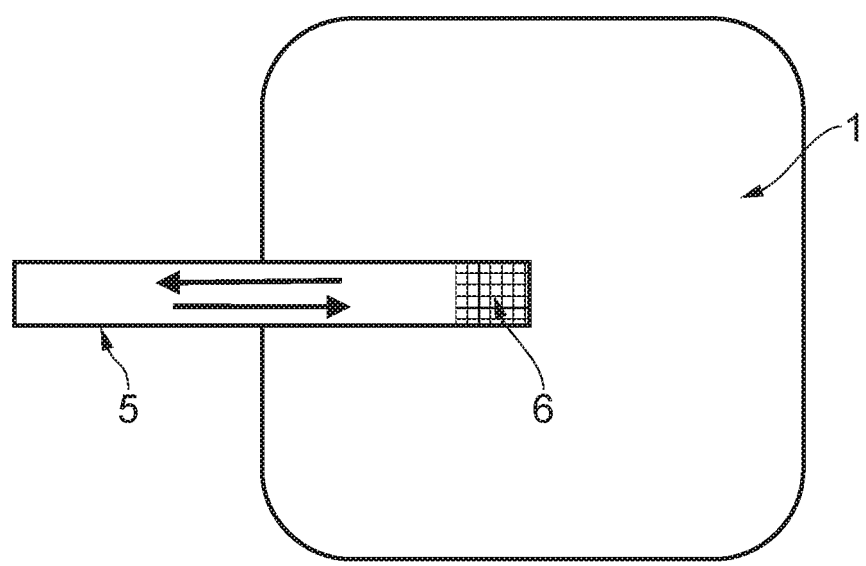
FIG. 11A shows a plan view of a flexible membrane comprising an electromagnetic waveguide in accordance with Optical Microphone Embodiment 1.
Figure 11B:
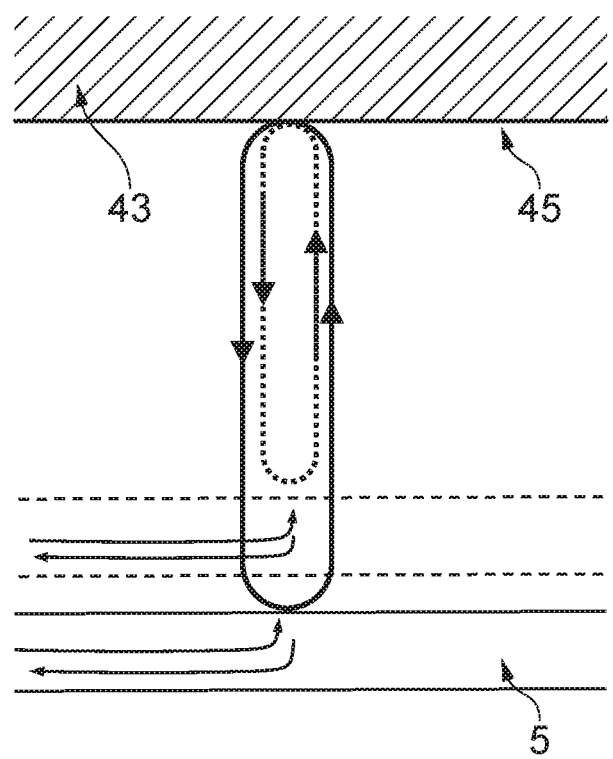
FIG. 11B shows the operating principle of Optical Microphone Embodiment 1.

FIG. 11A shows a flexible membrane 1 and electromagnetic waveguide 5 terminating in an electromagnetic wave diverter 6 for use in an optical microphone configuration in accordance with a first optical microphone configuration embodiment (Embodiment 1). The operating principle is shown in FIG. 11B. This example utilises a configuration similar to that of a Fabry-Pérot interferometer. In this example, the light that has propagated along the electromagnetic waveguide is diverted by an electromagnetic wave diverter 6 (not shown in FIG. 11B), such that the electromagnetic wave is emitted from the waveguide. In the example shown in FIG. 11A, the electromagnetic wave diverter is configured to divert the electromagnetic waves through an angle of approximately 90°, such that waves which were previously propagating through the waveguide approximately parallel to a planar surface of the flexible membrane (and along a primary axis of the waveguide) are coupled out of the waveguide, and are thus diverted to propagate at an angle normal to the plane surface of the membrane.

Any suitable component can be used as the electromagnetic wave diverter 6, such as a grating or a membrane reflective surface at a particular angle with respect to a plane of the flexible membrane. Where the electromagnetic waves are to be diverted through an angle of approximately 90°, the membrane reflective surface is positioned at an angle of 45°. Gratings essentially require a series of precisely spaced grooves to be formed on a surface of the electromagnetic waveguide, and can therefore be formed without requiring any additional components to be incorporated into the system and to any required specifications. The grating can also act to allow electromagnetic waves to re-enter the electromagnetic waveguide if necessary. Use of a membrane reflective surface allows the diverted electromagnetic waves to be directed precisely as required (dependent on the angle of the membrane reflective surface with respect to the direction of propagation of the electromagnetic waves).

The diverted wave travelling away from the planar surface of the flexible membrane is then incident on a reflector 43. The reflector comprises a reflective surface 45 that is reflective to the wavelength range of the electromagnetic wave. The reflective surface of Embodiment 1 is substantially parallel to the plane of the flexible membrane, and is further configured to reflect the electromagnetic wave that has been diverted by the diverter back towards the flexible membrane. Configurations of the reflector are discussed in greater detail below.

The reflected electromagnetic wave then re-enters the waveguide. In the present embodiment, the reflected electromagnetic wave re-enters the same waveguide as the electromagnetic wave was diverted out of by the diverter. The re-entry of the electromagnetic wave into the waveguide is facilitated by the diverter, which is configured to again divert the electromagnetic waves through an angle of approximately 90°, such that electromagnetic waves are once again travelling substantially parallel to the planar surface of the flexible membrane and propagating along the electromagnetic waveguide. However, in alternative configurations, the reflector reflective surface may be configured to reflect the electromagnetic waves at a further waveguide (where the entry of the electromagnetic wave into the waveguide can be facilitated by a further diverter), or may be configured to reflect the electromagnetic wave directly at an electromagnetic wave detector. Where the reflected electromagnetic waves subsequently re-enter the electromagnetic waveguide, this reduces the number of required components, thereby simplifying the formation of the system.

The electromagnetic waves then exit the electromagnetic waveguide and encounter an electromagnetic wave detector (not illustrated, but may be located similarly to detector 41 of FIG. 10), at which the wave is detected. The operating principle of Embodiment 1 is illustrated by FIG. 11B. In FIG. 11B, the position of the electromagnetic waveguide and the path of the electromagnetic wave when the flexible membrane is in an undisturbed position is indicated by solid lines, and the position of the electromagnetic waveguide and the path of the electromagnetic wave when the flexible membrane has moved is indicated by the dashed lines.

In this embodiment, the movement of the flexible membrane (and the corresponding movement of the electromagnetic waveguide) causes the separation between the point of emission of the electromagnetic waves from the waveguide and the reflective surface of the reflector to vary. The electromagnetic waves are monochromatic, and are emitted at a given phase. The system is configured such that the separation between the point of emission of the electromagnetic waves and the reflective surface (multiplied by two, as the wave must travel both ways) results in a known shift in the phase of the electromagnetic wave. This phase shift is monitored at the electromagnetic wave detector, allowing the position of the membrane (and hence the properties of incident sound waves) to be deduced.

Optical Microphone Embodiment 2

In the second optical microphone embodiment (Embodiment 2), the overall configuration of the optical microphone system is similar to that of Embodiment 1. As in Embodiment 1, the light that has propagated along the electromagnetic waveguide is diverted by an electromagnetic wave diverter 6, such that the electromagnetic wave is emitted from the waveguide. However, rather than being configured to divert the electromagnetic waves through an angle of approximately 90°, such that waves propagate normal to the plane of the flexible membrane, the diverter 6 is configured to couple the electromagnetic waves out of the waveguide, and thus divert the electromagnetic wave out of the plane of the flexible membrane at an angle other than 90°. The diverted wave propagation vector accordingly has a component parallel to the surface of the flexible membrane, in addition to having a component normal to the surface of the flexible membrane. Therefore, the reflected wave is incident on the surface of the flexible membrane at a position remote from the position from which the electromagnetic wave exited the waveguide on the flexible membrane.

Figure 12A:
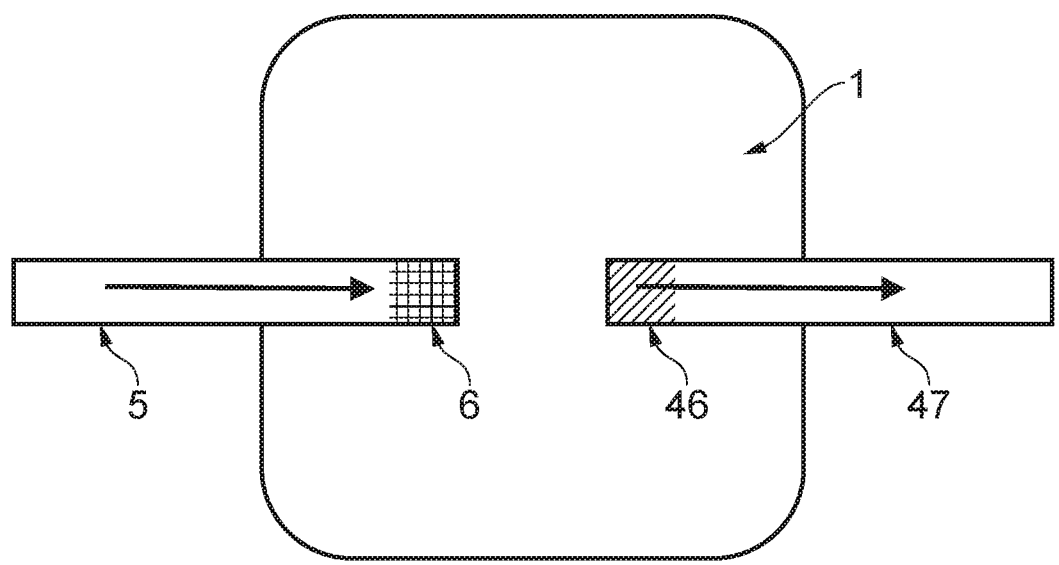
FIG. 12A shows a plan view of a flexible membrane comprising an electromagnetic waveguide in accordance with Optical Microphone Embodiment 2.
Figure 12B:
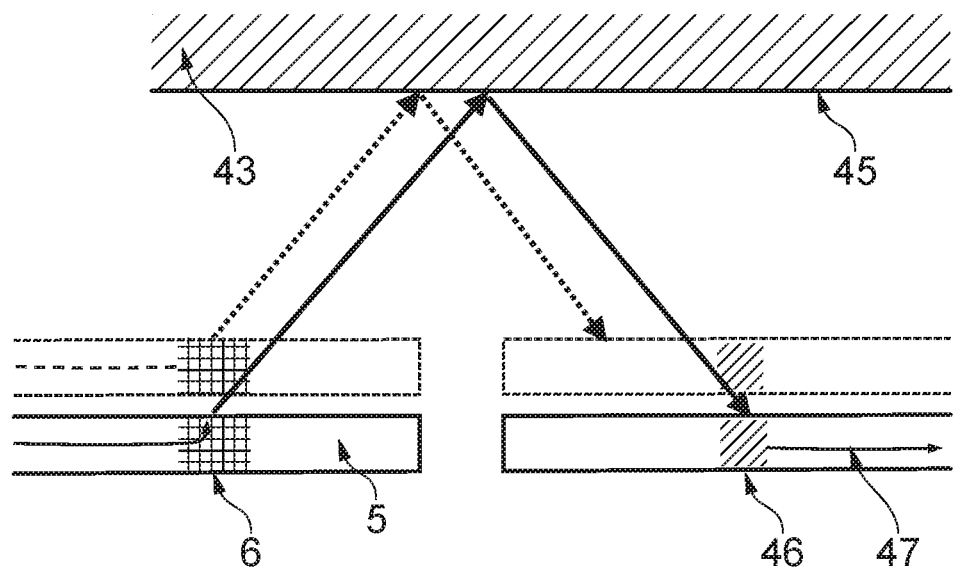
FIG. 12B shows the operating principle of Optical Microphone Embodiment 2.

A plan view of a flexible membrane and electromagnetic waveguide in accordance with Embodiment 2 is shown in FIG. 12A. The operating principle of this embodiment is illustrated by FIG. 12B. As with FIG. 11B and Embodiment 1, the position of the electromagnetic waveguide and the path of the electromagnetic wave when the flexible membrane is in an undisturbed position is indicated by solid lines, and the position of the electromagnetic waveguide and the path of the electromagnetic wave when the flexible membrane has moved is indicated by the dashed lines.

As in Embodiment 1, the diverted wave is reflected off a reflective surface 45 of a reflector 43 and propagates back towards the flexible membrane. In this example, it is not necessary for the reflective surface 45 to be substantially parallel to the plane of the flexible membrane; instead the reflective surface 45 serves to reflect the electromagnetic radiation generally back towards the flexible surface. The reflected wave is then incident on the flexible membrane.

In Embodiment 2, the position at which the reflected wave is incident upon the surface of the flexible membrane following reflection is dependent upon the separation between the point at which the electromagnetic wave is diverted out of the waveguide and the reflective surface, and also the separation between the reflective surface and the point at which the electromagnetic wave is incident upon the flexible membrane. This separation is also dependent upon the angle at which the electromagnetic wave exits the waveguide and the angle of reflection.

An area 46 in which the electromagnetic wave is incident upon the surface of the flexible membrane following reflection (when the membrane is in an undisturbed position) is configured to allow the electromagnetic wave to then enter an electromagnetic waveguide, which may be the same waveguide as the wave exited or a different waveguide. The area 46 may have a similar form to the electromagnetic wave diverter 6, or may use a different form. In the example shown in FIG. 12B, the electromagnetic wave enters a different electromagnetic waveguide 47 to the one from which it was emitted. The area 46 and the surrounding region of the flexible membrane are configured such that only light that is incident in the area 46 enters a waveguide. In particular, in the surrounding region shielding or material that absorbs light may be used to help prevent light that is incident in the surrounding region entering a waveguide, although the use of shielding or material that absorbs light is not always necessary and is not used in the example shown in FIGS. 12A and 12B. Accordingly, the amount of electromagnetic radiation that enters the waveguide is dependent on the position of the flexible membrane when the electromagnetic wave is diverted out of the waveguide, reflected, and re-enters a waveguide.

The electromagnetic radiation that enters a waveguide is the directed to an electromagnetic wave detector and detected. By monitoring the intensity of the electromagnetic radiation that re-enters a waveguide, it is possible to deduce the position of the flexible membrane as discussed above. The optical microphone in the present embodiment uses measurement of the intensity of detected electromagnetic radiation to monitor the movement of the flexible membrane, therefore the phase of the electromagnetic waves does not influence the results obtained.

Embodiment 1 and Embodiment 2 (as discussed above) utilise a reflective surface located on a reflector that is positioned separately from the flexible membrane. The nature of the reflector depends on the configuration of the optical microphone as a whole.

Figure 13A:
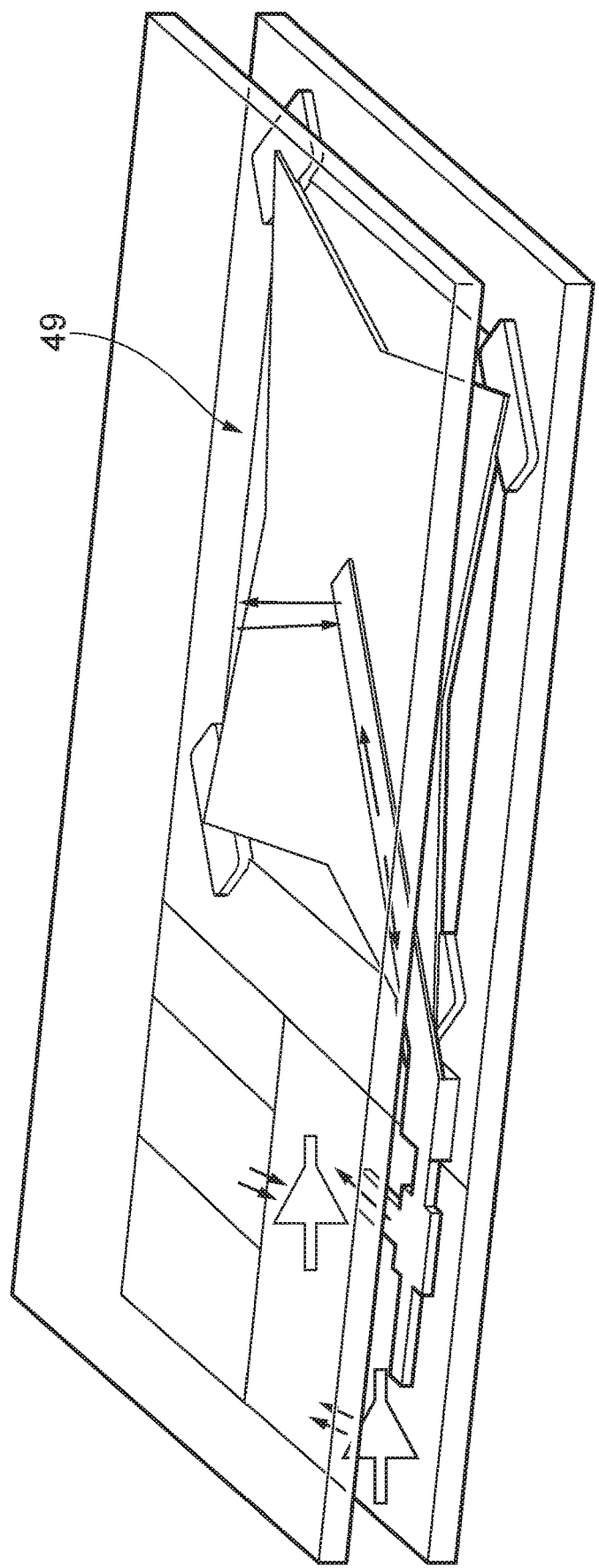
FIG. 13A shows a cross section of an example wherein a reflector is provided by an enclosure lid.

In some embodiments, the flexible membrane may be substantially enclosed within an enclosure, said enclosure including a lid 49 that is substantially parallel to the membrane. An example of an enclosure configuration is shown in FIG. 13A. If an optical microphone utilises a reflector, the lid of the enclosure can be used as the reflector. Where the lid of the enclosure is used as the reflector, the surface of the lid that faces the flexible membrane (which is the surface of the lid upon which the electromagnetic radiation is incident following deflection out of the electromagnetic waveguide) provides the reflective surface. The reflective surface is configured to reflect incident electromagnetic radiation back toward the flexible membrane, as discussed above. Use of the enclosure to support the reflector reduces the number of components required for the system, as the enclosure can serve a further purpose of protecting the flexible membrane and surrounding system.

Figure 13B:
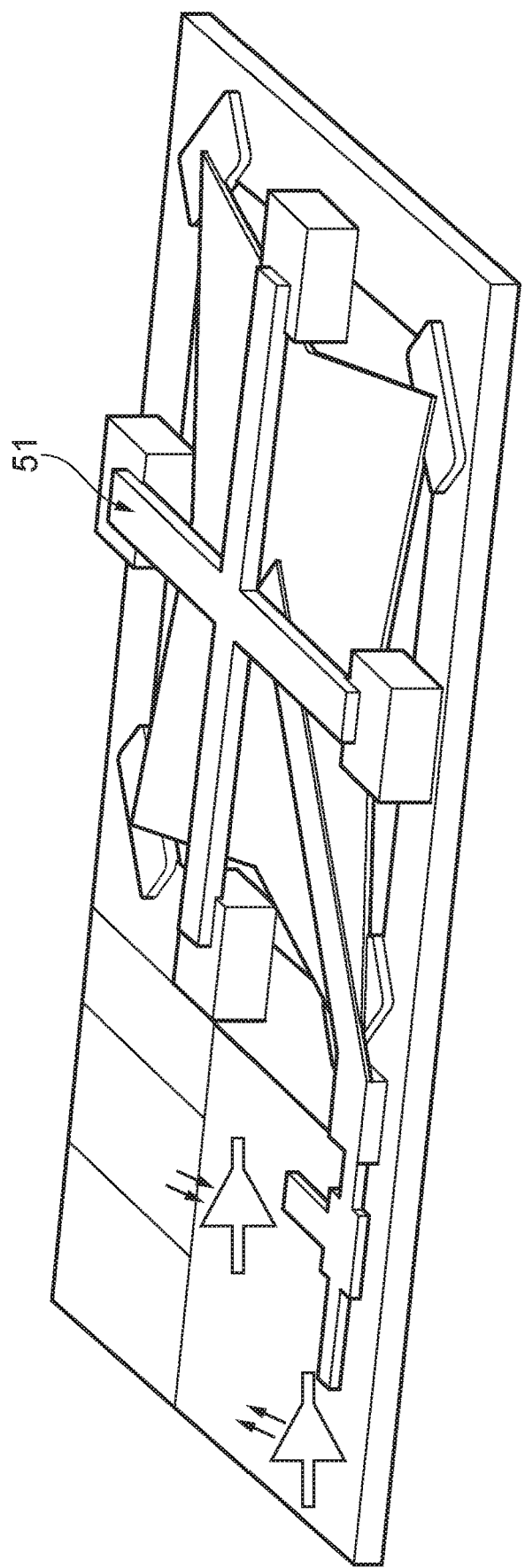
FIG. 13B shows a schematic of an example wherein a reflector is supported by a support scaffold.

As an alternative to using a surface of an enclosure as a reflector, a support scaffold 51 can be mounted on, or otherwise held in a fixed position in relation to, the substrate. An example of a support scaffold 51 is shown in FIG. 13B. In this figure, the scaffold is configured to support the reflector such that the reflective surface is positioned to reflect the incident electromagnetic radiation back towards the flexible membrane. The scaffold design shown in FIG. 13B is an example of the form of the support scaffold that may be used, however other forms of scaffold may also be used. Other suitable scaffold shapes may use arched beams or a mesh structure, for example. Any support scaffold design that is capable of supporting the reflector in a fixed position relative to the equilibrium or quiescent position of the flexible membrane may be used. The support scaffold is a structure that is stiffer than the flexible membrane, and is typically connected to the substrate to support the reflector in a fixed position relative to the substrate.

Both of Embodiments 1 and 2 require a reflector. Some configurations of the flexible membrane and electromagnetic waveguide(s) are such that a reflector is not required. Configurations which do not require the use of a reflector can be provided in a smaller enclosure, having a lower weight, and can also ensure that there are fewer potential emitters of noise or obstruction that may impede the operation of the flexible membrane. Some optical microphone configurations also do not require diverters. However, the reflector and connected structures can also provide a limiter (or hard stop), which can prevent the membrane suffering damage (such as tearing, deforming plastically or becoming detached from a substrate) due to deforming to an excessively large amount in response to an incoming stimulus in excess of safe operating level (for example, a loud sound, high pressure wave or high mass particle). For this reason, a lid or support scaffold may be used even for optical microphone configurations which do not require a reflector. Either the reflector, the support scaffold (or enclosure), or a combination of these components may provide the limiter that acts to limit the maximum flexible membrane deflection.

An embodiment of an optical microphone which does not require a reflector or a diverter is described below.

Optical Microphone Embodiment 3

Figure 14A:
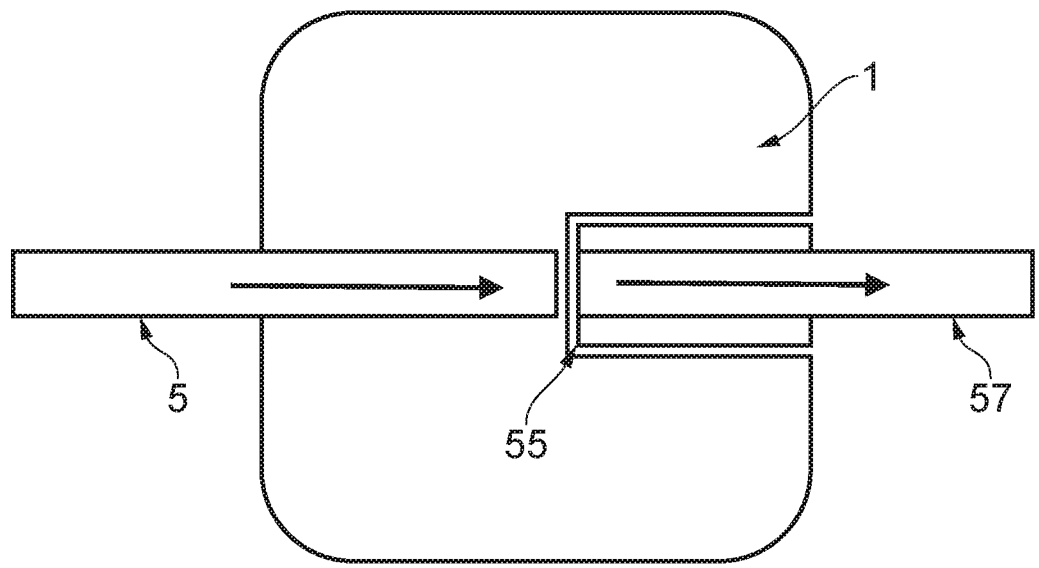
FIG. 14A shows a plan view of a flexible membrane comprising an electromagnetic waveguide in accordance with Optical Microphone Embodiment 3.
Figure 14B:
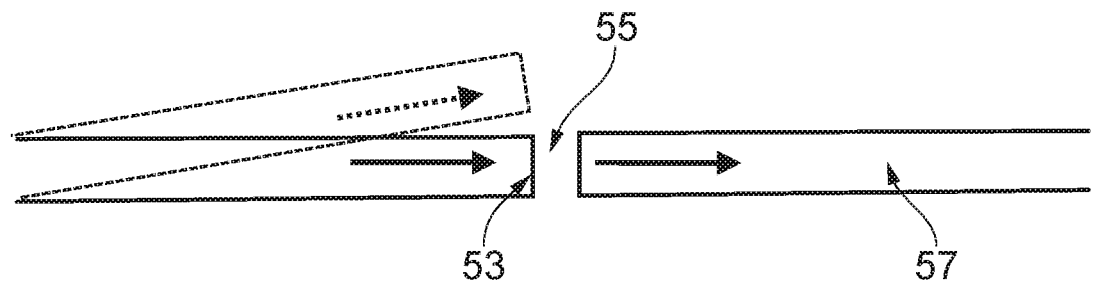
FIG. 14B shows the operating principle of Optical Microphone Embodiment 3.

A plan view of a flexible membrane and electromagnetic waveguide in accordance with a third optical microphone configuration embodiment (Embodiment 3) is shown in FIG. 14A. In this embodiment an electromagnetic wave enters the electromagnetic waveguide that is a component of the flexible membrane, as is the case in Embodiments 1 and 2. However, the electromagnetic wave does not encounter a diverter. Instead, the electromagnetic wave is incident upon a planar surface 53 of the electromagnetic waveguide that is perpendicular to the direction of propagation of the electromagnetic wave through the waveguide. This planar surface 53 is then followed (in the direction of propagation of the electromagnetic wave) by a space 55, and then by a contact member 57. In Embodiment 3, the contact member is a further electromagnetic waveguide, however different configurations of contact member can be used, and further embodiments are discussed below. In FIG. 14A, the contact member is in a fixed position relative to the substrate (and does not move with the movement of the flexible membrane), however the contact member may also be located on the flexible membrane and configured to move with the flexible membrane. The operating principle of Embodiment 3 is illustrated by FIG. 14B. In FIG. 14B, the position of the electromagnetic waveguide and the path of the electromagnetic wave when the flexible membrane is in an undisturbed position is indicated by solid lines, and the position of the electromagnetic waveguide and the path of the electromagnetic wave when the flexible membrane has moved is indicated by the dashed lines.

In Embodiment 3, a portion of the electromagnetic waves that have crossed the space 55 are then incident upon the further electromagnetic waveguide 57, and enter the further electromagnetic waveguide. This is known as end-fire coupling and, as mentioned above, does not require a diverter. The electromagnetic waves propagate down the further electromagnetic waveguide, and then encounter an electromagnetic wave detector.

The positioning of the electromagnetic waveguides and the space with respect to the flexible membrane results in a portion of the electromagnetic waves that exit through the planar surface not entering the further electromagnetic waveguide, and accordingly not reaching the electromagnetic wave detector, when flexible membrane is shifted from an equilibrium position. This is because the electromagnetic waves are emitted from the planar surface at a non-zero angle with respect to the further electromagnetic waveguide, and accordingly are not incident upon the further electromagnetic waveguide or are partially reflected from the surface of the further electromagnetic waveguide. This is illustrated in FIG. 14B using a dashed line.

As a result of the configuration of Embodiment 3, the intensity of the electromagnetic radiation recorded at the electromagnetic wave detector can be used to measure the degree of deflection of the flexible membrane relative to a quiescent position, and accordingly can be used to detect incident stimuli.

Various other configurations suitable for use in sensors such as optical microphones and not requiring a reflector are also provided, as discussed below.

Optical Microphone Embodiment 4

Figure 15A:
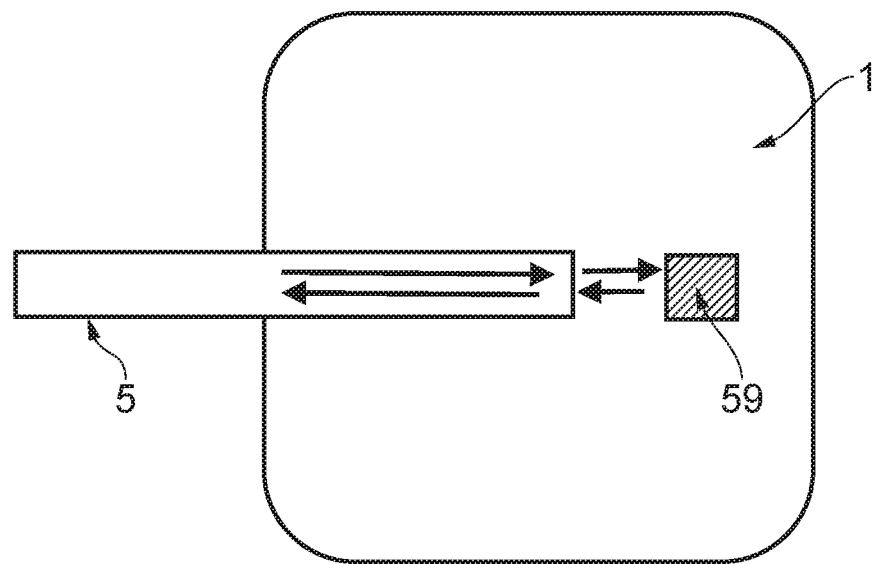
FIG. 15A shows a plan view of a flexible membrane comprising an electromagnetic waveguide in accordance with Optical Microphone Embodiment 4.
Figure 15B:
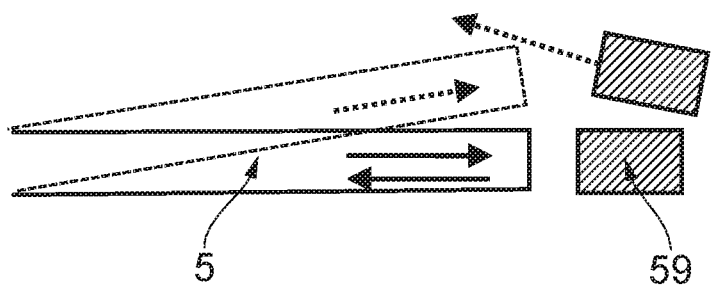
FIG. 15B shows the operating principle of Optical Microphone Embodiment 4.

The configuration of a fourth optical microphone configuration embodiment (Embodiment 4) is shown in plan view in FIG. 15A. The configuration is similar in several respects to that of Embodiment 3. Similarly to Embodiment 3, the electromagnetic wave propagates along the electromagnetic waveguide, across a space and encounters a contact member. In Embodiment 4, the contact member comprises a contact member reflective surface 59 that is parallel to the planar surface of the electromagnetic waveguide when the flexible membrane is in an undisturbed position. As the flexible membrane moves, the angular relationship between the electromagnetic waveguide and the contact member varies, similarly to that between the electromagnetic waveguide and the further electromagnetic waveguide in Embodiment 3. The operating principle of Embodiment 4 is illustrated by FIG. 15B. In FIG. 15B, the position of the electromagnetic waveguide and the path of the electromagnetic wave when the flexible membrane is in an undisturbed position is indicated by solid lines, and the position of the electromagnetic waveguide and the path of the electromagnetic wave when the flexible membrane has moved is indicated by the dashed lines When in an undisturbed position, the electromagnetic wave exits the electromagnetic waveguide, crosses the space, reflects off the contact member reflective surface, crosses the space once again and then re-enters the electromagnetic waveguide. The electromagnetic wave then propagates along the electromagnetic waveguide, and encounters an electromagnetic wave detector where it is detected. As in the situation described above in the context of Embodiment 3, an increase in the deflection of the flexible membrane results in a larger proportion of the electromagnetic radiation emitted from the planar surface of the electromagnetic waveguide not contacting the contact member, not being incident upon the electromagnetic waveguide following reflection off the contact member reflective surface, or reflecting off the planar surface of the electromagnetic waveguide due to the incidence angle upon the planar surface of the electromagnetic wave. Accordingly, as in the case of Embodiment 3, the intensity of the detected electromagnetic radiation at the electromagnetic wave detector can be used as a measure of the deflection of the flexible membrane.

The optical microphone configurations described in both Embodiment 3 and Embodiment 4 use a planar surface of an electromagnetic waveguide (substantially perpendicular to a direction of propagation of the electromagnetic wave through the waveguide) and a space following the planar surface in the initial direction of wave propagation. In the further embodiments discussed below, neither of these features is utilised.

Optical Microphone Embodiment 5

Figure 16:
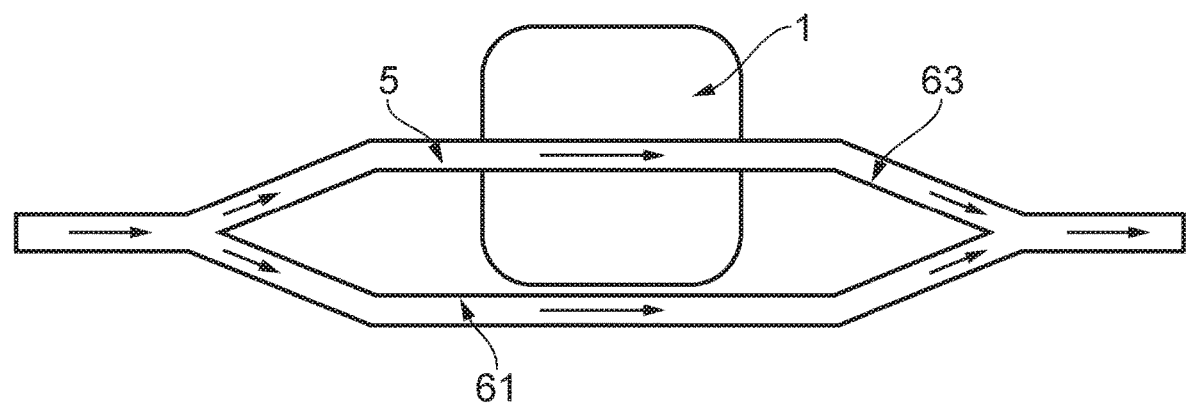
FIG. 16 shows a plan view of a flexible membrane comprising an electromagnetic waveguide in accordance with Optical Microphone Embodiment 5.

A fifth optical microphone configuration embodiment (Embodiment 5) is based on the configuration of a Mach-Zehnder interferometer. A plan view of a flexible membrane and electromagnetic waveguide in accordance with Embodiment 5 is shown in FIG. 16. The configuration of Embodiment 5 utilises a beam splitter (not shown) to split monochromatic electromagnetic radiation emitted from an electromagnetic wave emitter into two portions. Any suitable beam splitting device can be used; Embodiment 5 uses a half silvered mirror. The two portions pass down two separate paths formed by one or more electromagnetic waveguides, before recombining at a recombination point. The first of these paths is a reference path 61, which passes from the beam splitter to the recombination point without passing over the flexible membrane. The second path is a sample path 63 that passes over the flexible membrane to reach the recombination point.

When the flexible membrane is in an undisturbed position, the lengths of the sample path 63 and the reference path 61 (between the beam splitter and the recombination point) are equal. Prior to splitting, the monochromatic electromagnetic radiation has a single phase. If the lengths of the sample path and the reference path remain the same (because the flexible membrane does not move as the electromagnetic radiation passes down the sample path and reference path), then the electromagnetic radiation sent down the sample path and the electromagnetic radiation sent down the reference path remain in phase with one another. By contrast, if the flexible membrane is moved from the undisturbed position while the electromagnetic radiation travels down the paths, this increases the length of the sample path relative to an undisturbed position. Accordingly, the electromagnetic wave that passes along the sample path undergoes a phase shift relative to the electromagnetic wave that passes along the reference path, such that the two waves are no longer perfectly in phase with one another.

The electromagnetic waves recombine at the recombination point. If the electromagnetic wave that passed along the sample path has undergone a phase shift relative to the electromagnetic wave that passed along the reference path, the recombined waves will generate an interference pattern. Measurements of interference patterns resulting from the interaction of the wave from the reference path and the wave from the sample path allow a degree of phase shift to be detected, which in turn allows the deflection of the flexible membrane to be obtained.

Optical Microphone Embodiment 6

Figure 17:
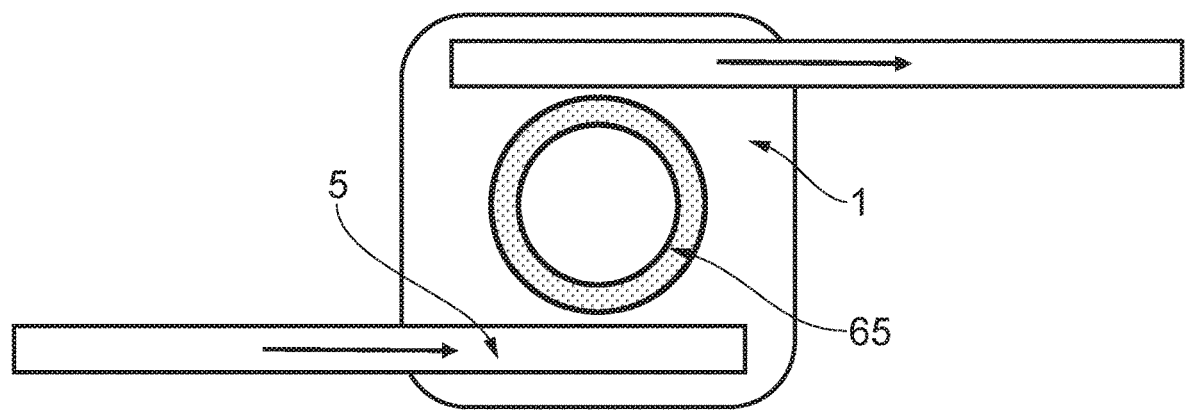
FIG. 17 shows a plan view of a flexible membrane comprising an electromagnetic waveguide in accordance with Optical Microphone Embodiment 6.

A sixth optical microphone configuration embodiment (Embodiment 6) uses a configuration similar to that of an optical ring resonator. A plan view of a flexible membrane and electromagnetic waveguide in accordance with Embodiment 6 is shown in FIG. 17. In Embodiment 6, an electromagnetic waveguide is used to transmit electromagnetic radiation to a ring shaped resonator 65. The ring shaped resonator 65 is located on the flexible membrane. After passing through the ring shaped resonator, the electromagnetic radiation then enters an electromagnetic waveguide, along which the electromagnetic radiation propagates to an electromagnetic radiation detector. In the configuration shown in Embodiment 6, the electromagnetic radiation enters a further electromagnetic waveguide after exiting the ring shaped resonator, however in alternative configurations the electromagnetic radiation re-enters the electromagnetic waveguide along which it initially propagated to the ring shaped resonator.

While the electromagnetic radiation propagates through the ring shaped resonator 65, interference occurs. When the wavelength of the electromagnetic radiation is equal to the resonant wavelength of the ring shaped resonator, constructive interference results in an increase in the in intensity of the electromagnetic radiation as the electromagnetic radiation propagates around the ring shaped resonator. The shape of the ring shaped resonator is altered by movement of the flexible membrane, due to the resulting deformation of the ring shaped resonator, which in turn results in an alteration of the resonant wavelength of the ring shaped resonator. The alterations in the resonant wavelength influence the constructive interference of the electromagnetic radiation in the ring shaped resonator, thereby altering the intensity of the electromagnetic radiation. The intensity variation is then detected by the electromagnetic radiation detector, allowing the deformation of the flexible membrane to be detected using the electromagnetic radiation detector. As an alternative to the use of a ring shaped resonator 65, a grating structure may also be located on the surface of the flexible membrane. Where a grating structure is located on the flexible membrane, the grating structure replaces the ring shaped resonator and serves the same purpose as the ring shaped resonator. That is, the grating structure acts as a resonance structure for the electromagnetic radiation, in which interference occurs. Similarly to the ring shaped resonator, the shape of the grating structure varies as the flexible membrane moves, resulting in variations in the interference of the electromagnetic radiation propagating in the grating structure and corresponding intensity variations. The intensity variation is then detected by the electromagnetic radiation detector, allowing the deformation of the flexible membrane to be detected using the electromagnetic radiation detector.

Examples provide an optical microphone that is suitable for use in a portable electronic device, such as a mobile phone, laptop computer, and so on. All of the examples discussed above (including Optical Microphone Embodiments 1 to 6) are suitable for this purpose, wherein the deformation of the flexible membrane is in response to incident sound waves. By monitoring the deformation of the flexible membrane it is therefore possible to detect the sound waves, using any of the configurations discussed above.

In order to allow the physical dimensions of portable electronic devices to be minimised, and also to provide free volume within portable electronic devices that can be filled with other components of the devices, it can be desirable to provide additional capabilities as well as optical microphone functionality. Accordingly, some examples are configured to allow one or more additional functions to be provided. An example of an additional function which can be provided by examples is the detection of particulate matter, such as smoke, steam, fumes (such as exhaust fumes), pollen or other particulate matter. Further examples of additional functions include using the portable electronic device as a depth gauge (to indicate, for example, a depth of water in which the device is submerged), or as a barometer for the purposes of forecasting weather.

For some examples, the provision of the additional functions does not require any additional components to be included, beyond the components used in the optical microphone system. For example, where the additional function is that of a barometer, the deflection of the flexible membrane used in the optical microphone can be used to determine the atmospheric pressure, which can then be used in weather forecasting. Other examples do include additional components that are used to provide the additional functions. In some instances, the additional components are an optional design choice, for example, the use of a further flexible membrane (different to the flexible membrane used in the optical microphone system) in a barometer function. However, for some additional functions the additional components are required. Some examples of the particulate matter detection additional function require additional components.

The operation of the optical microphone requires the provision of an electromagnetic wave emitter, as discussed in detail above. Where the optical microphone is configured to provide the additional function of particulate matter detection, a portion of the electromagnetic radiation generated by the electromagnetic radiation emitter may be diverted shortly after generation, and not used in the detection of the deflection of the flexible membrane (used in the sound sensing of the optical microphone). Instead, the diverted electromagnetic radiation can be directed (using a convenient electromagnetic radiation guide, such as an optical fibre) towards a physical volume 67 that is open to, and in fluid communication with, the atmosphere.

In the event that the atmosphere in the vicinity of the system contains particulate matter 69, the particulate matter 69 can enter the physical volume 67. As discussed above, the particulate matter 69 can be smoke, steam, fumes, pollen or any other matter wherein the particles are of sufficiently low weight to be dispersed in suspension in the atmosphere. Because the physical volume 67 is open to the atmosphere, the concentration of the particulate matter 69 in the physical volume 67 should be approximately equal to that in the surrounding atmosphere.

Figure 18A:
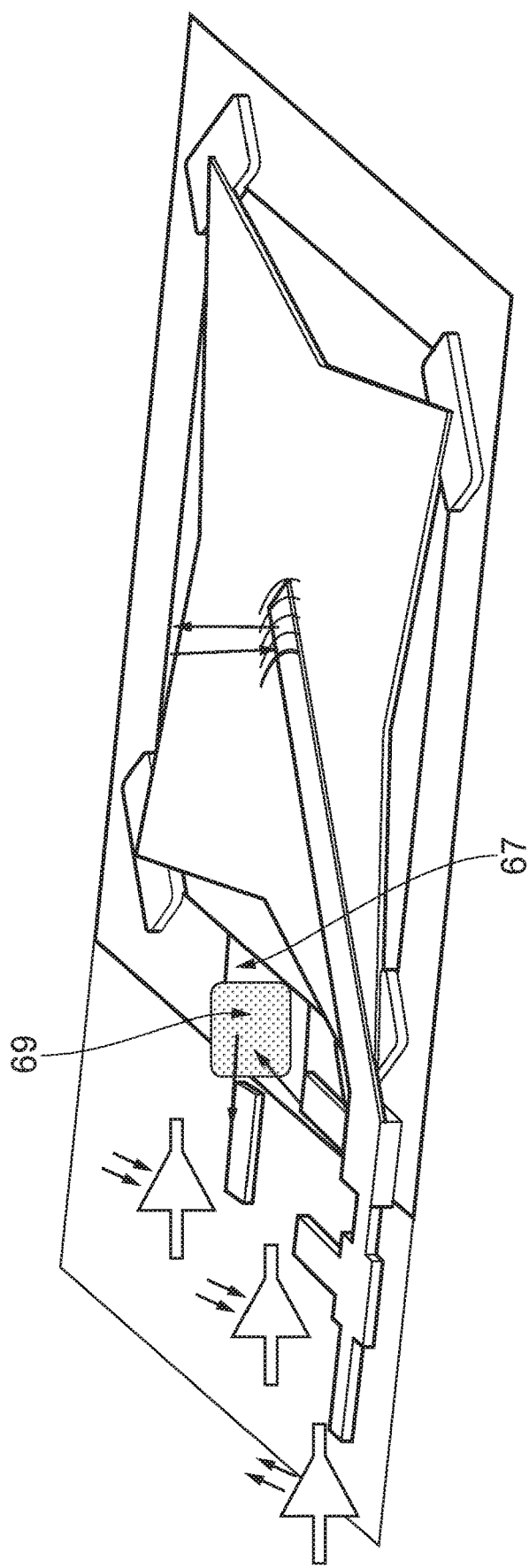
FIG. 18A shows a first configuration of an example comprising a particulate matter detector.
Figure 18B:
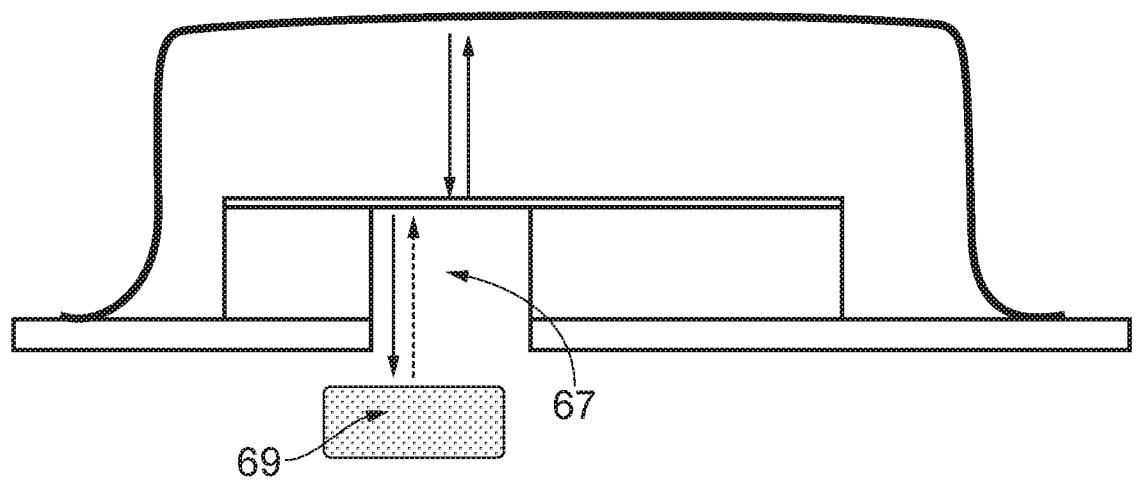
FIG. 18B shows a second configuration of an example comprising a particulate matter detector.
Figure 18C:
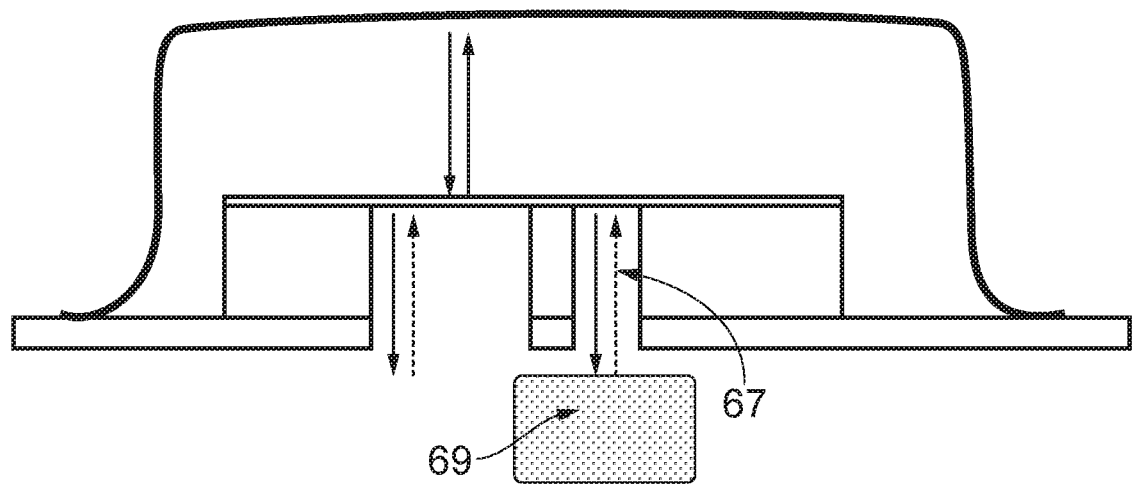
FIG. 18C shows a third configuration of an example comprising a particulate matter detector.

Several different configurations can be used to integrate the physical volume 67 into the system. In particular, the physical volume 67 can be included in the plane of the flexible membrane, or out of the plane of the flexible membrane. When the physical volume 67 is in the plane of the flexible membrane, as shown in FIG. 18A, this necessitates modification of the structure surrounding the flexible membrane to provide fluid communication with the surrounding atmosphere. However, fewer components are required to provide the path for the electromagnetic wave to the physical volume, and from the physical volume to the detector. When the physical volume is out of the plane of the flexible membrane, additional components are necessary to divert the electromagnetic wave into the physical volume, and to direct the electromagnetic wave from the physical volume to the electromagnetic wave detector. However, there is an increased degree of versatility in the positioning of the physical volume, which can use a volume provided to allow sound to reach the flexible membrane of the optical microphone, such as a substrate cavity (as shown in FIG. 18B), or can use a different volume (as shown in FIG. 18C). The physical volume does not require boundaries prescribed by the structure of the device; where scattered electromagnetic radiation is detected (as discussed below) the electromagnetic radiation can simply be directed into the atmosphere, and backscattered electromagnetic radiation intensity used as a measure of particulate matter concentration.

In operation, the electromagnetic wave is directed into the physical volume 67. Where particulate matter 69 is present in the physical volume, the electromagnetic wave is scattered by the particulate matter. An electromagnetic wave guide is positioned in such a way as to be able to receive electromagnetic radiation that is present in the physical volume. This can be the same electromagnetic wave guide as was used to direct the electromagnetic wave from the electromagnetic wave emitter into the physical volume, or a different electromagnetic wave guide.

The electromagnetic wave guide positioned to receive the electromagnetic wave can be positioned such that electromagnetic radiation that is scattered by particulate matter in the physical volume does not reach the electromagnetic wave guide, because the guide is positioned such that electromagnetic radiation that passes through the physical volume without diversion is incident upon the guide. Alternatively, the guide can be positioned such that only scattered electromagnetic radiation can be incident upon the guide. The electromagnetic wave guide positioned to receive the electromagnetic wave is configured to direct the electromagnetic wave that has been received to an electromagnetic wave detector, which can be the same electromagnetic wave detector as is used by the optical microphone or a different electromagnetic wave detector.

By monitoring the intensity of the electromagnetic radiation using the electromagnetic wave detector, it is possible to monitor the concentration of particulate matter in the physical volume. Where the guide is positioned to receive unscattered electromagnetic radiation, the concentration of the particulate matter in the physical volume is inversely proportional to the intensity of the electromagnetic radiation detected by the detector. Where the guide is positioned to receive scattered electromagnetic radiation, the concentration of the particulate matter in the physical volume is directly proportional to the intensity of the electromagnetic radiation detected by the detector.

It is possible to provide a plurality of additional functions, by combining the features discussed above. Further, and as discussed above, components may be utilised to provide plural additional functions, thereby further reducing the volume occupied by the systems relative to a plurality of separate systems each providing a single function.

As will be appreciated, the above detailed description is provided by way of example only, and the scope of the invention is defined by the claims.

It should be understood that the various relative terms upper, lower, top, bottom, underside, overlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

Examples described herein may be usefully implemented in a range of different material systems, however the examples described herein are particularly advantageous for MEMS transducers having membrane layers comprising silicon nitride.

In the examples described above it is noted that references to a transducer may comprise various forms of transducer element. For example, a transducer may be typically mounted on a die and may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

Examples of the microelectromechanical system may be formed wherein the flexible membrane (and electromagnetic waveguide), electromagnetic wave emitter, electromagnetic wave detector and circuitry (such as a CMOS circuit) are all located on a single chip or die. This allows that the microelectromechanical system can easily be substituted for a known system in an electronic device fabrication process, because the assembly and handling of the microelectromechanical system is similar to that of a known system. Accordingly, an example of the microelectromechanical system configured to operate as an optical microphone can be simply substituted for a known microphone system.

It is noted that the examples described above may be used in a range of devices, including, but not limited to: analogue microphones, digital microphones, pressure sensors or ultrasonic transducers. Examples may also be used in a number of applications, including, but not limited to, consumer applications, medical applications, industrial applications and automotive applications. For example, typical consumer applications include a portable device; a battery power device; a computing device; a communications device; a gaming device; a mobile telephone; an earphone, a personal media player; a laptop, tablet or notebook computing device. Examples may also be used in voice activated or voice controlled devices. Typical medical applications include hearing aids. Typical industrial applications include active noise cancellation. Typical automotive applications include hands-free sets, acoustic crash sensors and active noise cancellation. Examples may also be used in devices providing a plurality of the above functions.

It should be noted that the above-mentioned examples illustrate rather than limit the invention, and that those skilled in the art will be able to design many alternative configurations without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS microphone comprising:
an electromagnetic wave detector;
an electromagnetic wave emitter; and
a flexible membrane, the flexible membrane comprising an electromagnetic waveguide,
wherein the flexible membrane is displaced in response to sound waves incident on the flexible membrane, and
wherein the MEMS microphone is configured to detect the flexible membrane displacement using alterations in one or more properties of an electromagnetic wave that is: emitted by the electromagnetic wave emitter; passed through the electromagnetic waveguide; and detected by the electromagnetic wave detector.

2. The MEMS microphone of claim 1, wherein the electromagnetic waveguide is formed integrally with the flexible membrane, the electromagnetic waveguide and flexible membrane being formed from substantially the same material as a single piece.

3. The MEMS microphone of claim 1, wherein the electromagnetic waveguide is an optical waveguide, and the MEMS microphone is an optical microphone.

4. The MEMS microphone of claim 3, wherein the optical waveguide is configured to guide an optical electromagnetic wave having a wavelength between 390 nm and 700 nm.

5. The MEMS microphone of claim 1, wherein the flexible membrane further comprises a balancing member, wherein the flexible membrane and the balancing member are integrally formed from substantially the same material.

6. The MEMS microphone of claim 1, wherein the flexible membrane has one of: a substantially circular shape; or a substantially rectangular shape; or a substantially square shape.

7. The MEMS microphone of claim 1, wherein: the electromagnetic waveguide is one of: a rib-type electromagnetic waveguide; or a cover type electromagnetic waveguide; or a gradiated refractive index-type electromagnetic waveguide.

8. The MEMS microphone of claim 1 further comprising a substrate, the substrate comprising a support section, wherein the flexible membrane forms part of a membrane layer, the membrane layer further comprising a connecting section that is connected to the support section, and wherein the position of the connecting section is fixed with respect to the support section.

9. The MEMS microphone of claim 1 further comprising a substrate, wherein the substrate comprises the electromagnetic wave detector.

10. The MEMS microphone of claim 9, wherein the electromagnetic wave detector is a photodiode.

11. The MEMS microphone of claim 1, wherein the electromagnetic waveguide comprises an electromagnetic wave diverter configured to divert electromagnetic waves, thereby causing electromagnetic waves to be emitted from the electromagnetic waveguide.

12. The MEMS microphone of claim 11, wherein the electromagnetic wave diverter is one of: a grating; or a membrane reflective surface angled with respect to the plane of the flexible membrane.

13. The MEMS microphone of claim 1, wherein: the electromagnetic waveguide of the flexible membrane forms part of a sample path between a beam splitter and a recombination point, and wherein a further electromagnetic waveguide forms a reference path between the beam splitter and the recombination point, the reference path being located adjacent to the flexible membrane;

or wherein the flexible membrane comprises a ring shaped resonator that is configured to receive electromagnetic radiation from the electromagnetic waveguide, and to transmit electromagnetic radiation on to the electromagnetic waveguide or a further electromagnetic waveguide;

or wherein the flexible membrane comprises a grating structure that is configured to receive electromagnetic radiation from the electromagnetic waveguide, and to transmit electromagnetic radiation on to the electromagnetic waveguide or a further electromagnetic waveguide.

14. The MEMS microphone of claim 1, wherein the MEMS microphone is configured to provide an additional function.

15. The MEMS microphone of claim 14, wherein the additional function is the detection of particulate matter.

16. The MEMS microphone of claim 1 further comprising a substrate, wherein the substrate comprises a cavity and the flexible membrane is located above the cavity in the substrate.

17. An electronic device comprising a MEMS microphone as claimed in claim 1, wherein the device is one of: a portable device; or a battery power device; or a computing device; or a communications device; or a gaming device; or a mobile telephone; or an earphone or in-ear hearing aid, or a personal media player; or a laptop, tablet or notebook computing device.

18. The MEMS microphone of claim 1, further comprising a substrate, wherein the substrate further comprises the electromagnetic wave emitter.

19. The MEMS microphone of claim 18, wherein the electromagnetic wave emitter is one of: an LED; or a semiconductor laser; or an OLED; or a VCSEL.

20. The MEMS microphone of claim 18, wherein the substrate further comprises the electromagnetic wave detector.

* * * * *